United States Patent
Minami

(10) Patent No.: US 9,702,038 B2
(45) Date of Patent: Jul. 11, 2017

(54) PRESSURE SENSOR AND METHOD FOR MANUFACTURING THE SAME

(71) Applicant: TOKYO ELECTRON LIMITED, Tokyo (JP)

(72) Inventor: Tomohide Minami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 220 days.

(21) Appl. No.: 14/734,121

(22) Filed: Jun. 9, 2015

(65) Prior Publication Data

US 2015/0377812 A1    Dec. 31, 2015

(30) Foreign Application Priority Data

Jun. 27, 2014  (JP) ................................. 2014-133267

(51) Int. Cl.
  *G01L 21/12*    (2006.01)
  *C23C 14/58*    (2006.01)

(52) U.S. Cl.
  CPC .......... *C23C 14/5873* (2013.01); *G01L 21/12* (2013.01)

(58) Field of Classification Search
  CPC ........................... G01L 21/12; C23C 14/5873
  See application file for complete search history.

(56) References Cited

U.S. PATENT DOCUMENTS

| | | | | |
|---|---|---|---|---|
| 4,812,801 A | * | 3/1989 | Halvis | G01L 21/12 338/36 |
| 5,557,972 A | * | 9/1996 | Jacobs | G01L 21/12 73/755 |
| 5,597,957 A | * | 1/1997 | Schieferdecker | G01L 21/10 73/708 |
| 6,013,935 A | * | 1/2000 | Shie | H01L 27/16 257/419 |
| 2008/0168842 A1 | * | 7/2008 | Higashi | G01L 21/10 73/755 |
| 2015/0128712 A1 | * | 5/2015 | Mercier | G01L 9/0008 73/702 |

FOREIGN PATENT DOCUMENTS

| | | | | |
|---|---|---|---|---|
| GB | 2368647 A | * | 5/2002 | ............. G01L 21/12 |
| JP | 2001343302 A | * | 12/2001 | ............. G01L 21/12 |
| JP | 2008-111778 A | | 5/2008 | |
| JP | 2009-300381 A | | 12/2009 | |

* cited by examiner

*Primary Examiner* — Nguyen Ha
(74) *Attorney, Agent, or Firm* — Rothwell, Figg, Ernst & Manbeck, P.C.

(57) ABSTRACT

Disclosed is a pressure sensor that outputs a temperature change caused in an electrical resistor according to a pressure of a gas, as a resistance change in the electrical resistor. The pressure sensor includes: a base substrate including a recess formed therein, a floating film formed on the base substrate, a heater formed on a surface of the floating film and configured to heat the floating film when a current flows therein, and a temperature sensor formed as the electrical resistor on the surface of the floating film. The temperature sensor changes a voltage drop with respect to a current flowing therein according to the temperature of the floating film.

9 Claims, 25 Drawing Sheets

PRESSURE SENSOR AND METHOD FOR MANUFACTURING THE SAME

CROSS-REFERENCE TO RELATED APPLICATIONS

This application is based on and claims priority from Japanese Patent Application No. 2014-133267, filed on Jun. 27, 2014, with the Japan Patent Office, the disclosures of which are incorporated herein in its entirety by reference.

TECHNICAL FIELD

Various aspects and exemplary embodiments of the present disclosure are related to a pressure sensor and a method for manufacturing the same.

BACKGROUND

A Pirani vacuum gauge has been known as a device for measuring a pressure of a gas. The Pirani vacuum gauge is provided with, for example, a filament (electrical resistor) formed of a fine metal wire, and configured to measure the pressure of a gas based on a quantity of heat loss of the filament which is caused by heat exchange between the filament and the gas. Further, with the recent advancement in a micro-electro mechanical system (MEMS) technology, the miniaturization of the pressure sensor using the principle of the Pirani vacuum gauge has progressed. See, for example, Japanese Patent Laid-Open Publication No. 2008-111778 and Japanese Patent Laid-Open Publication No. 2009-300381.

SUMMARY

According to an aspect of the present disclosure, there is provided a pressure sensor that outputs a temperature change caused in an electrical resistor according to a pressure of a gas, as a resistance change in the electrical resistor. The pressure sensor includes: a base substrate including a recess formed therein; a floating film formed on the base substrate to extend across the recess; a heater formed on a surface of the floating film, the heater being configured to heat the floating film when a current flows therein; and a temperature sensor formed as the electrical resistor on the surface of the floating film. The temperature sensor is configured to change a voltage drop with respect to a current flowing therein according to the temperature of the floating film. The current flowing in the temperature sensor is smaller than the current flowing in the heater.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
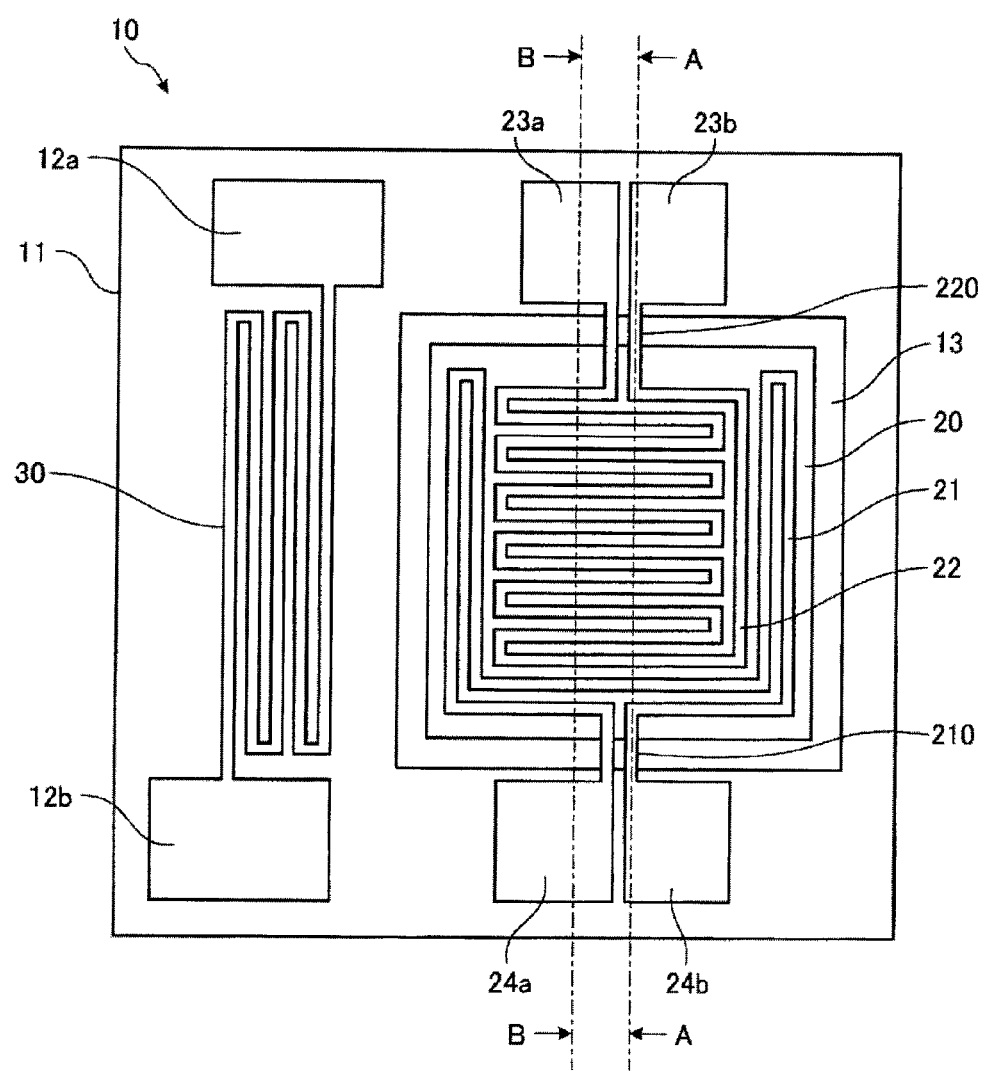
FIG. 1 is a plan view illustrating an exemplary sensor module in a first exemplary embodiment.

In the following detailed description, reference is made to th0e accompanying drawing, which form a part hereof. The illustrative embodiments described in the detailed description, drawing, and claims are not meant to be limiting. Other exemplary embodiments may be utilized, and other changes may be made, without departing from the spirit or scope of the subject matter presented here.

When a pressure sensor using the principle of the Pirani vacuum gauge manufactured by the MEMS technology, a metal film is formed on a substrate and then etched into a predetermined pattern, thereby forming a fine metal wire used as an electrical resistor that exchanges heat with a gas. The metal film is generally formed on the substrate through a normal-temperature sputtering.

However, since the metal film formed through the normal-temperature sputtering has a low deposition temperature, a metal atom that has reached the substrate hardly grows into a crystal nucleus. Thus, the metal film formed through the normal-temperature sputtering has small crystals and a lot of voids. In addition, when a current flows in the fine metal wire formed by etching the metal film formed through the normal-temperature sputtering, the voids within the fine metal wire grow so that the resistance of the fine metal wire is changed.

The Pirani vacuum gauge detects a temperature change caused in the electrical resistor according to the heat quantity taken out by a gas, as a resistance change in the electrical resistor, and determines the pressure of the gas based on the resistance change in the electrical resistor. However, when the fine metal wire formed of the metal film formed through the normal-temperature sputtering is used, the resistance of the fine metal wire is changed by the current flowing in the metal wire. Thus, since the resistance of the electrical resistor is also changed due to a factor other than the heat quantity taken out by the gas, and thus, the precision of measuring the pressure of the gas is degraded.

According to an aspect of the present disclosure, there is provided a pressure sensor that outputs a temperature change caused in an electrical resistor according to a pressure of a gas, as a resistance change in the electrical resistor. The pressure sensor includes: a base substrate including a recess formed therein; a floating film formed on the base substrate to extend across the recess; a heater formed on a surface of the floating film, the heater being configured to heat the floating film when a current flows therein; and a temperature sensor formed as the electrical resistor on the surface of the floating film. The temperature sensor is configured to change a voltage drop with respect to a current flowing therein according to the temperature of the floating film. The current flowing in the temperature sensor is smaller than the current flowing in the heater.

In one exemplary embodiment of the pressure sensor disclosed herein, the heater and the temperature sensor may be formed on the same surface of the floating film.

In one exemplary embodiment of the pressure sensor disclosed herein, the heater may be formed on one surface of the floating film, and the temperature sensor is formed on the other surface of the floating film.

In one exemplary embodiment of the pressure sensor disclosed herein, the current flowing in the temperature sensor may range from 1/30 times to 1/5 times the current flowing in the heater.

In one exemplary embodiment of the pressure sensor disclosed herein, the floating film may include a layer formed of an insulative material.

In one exemplary embodiment of the pressure sensor disclosed herein, the floating film may have a function of uniformizing heat generated by the heater within the floating film.

In one exemplary embodiment of the pressure sensor disclosed herein, the floating film may include a layer formed of a silicon-containing material, and the function of uniformizing the heat generated by the heater within the floating film may be implemented through the layer formed of the silicon-containing material.

In one exemplary embodiment of the pressure sensor disclosed herein, the heater may be formed of a material including at least one of platinum, nickel, chromium, and tungsten.

According to another aspect of the present disclosure, there is provided a method for manufacturing a pressure sensor that outputs a temperature change caused in an electrical resistor according to a pressure of a gas, as a resistance change in the electrical resistor. The method includes: forming a heater on one surface of a floating film to heat the floating film; forming a temperature sensor as the electrical resistor on the other surface of the floating film, in which the temperature sensor is configured to change a voltage drop with respect to a current flowing therein according on a temperature of the floating film and the current flowing in the temperature sensor is smaller than the current flowing in the heater; and disposing the floating film, on which the heater and the temperature sensor are formed, on a base substrate including a recess formed therein, to extend across the recess.

According to various aspects and exemplary embodiments of the present disclosure, a pressure sensor capable of measuring a gas pressure with high precision and a method for manufacturing the same can be achieved.

Hereinafter, exemplary embodiments of a pressure sensor disclosed herein and a method for manufacturing the same will be described with reference to the accompanying drawings. However, the present disclosure is not limited by the exemplary embodiments. Further, respective exemplary embodiments may be combined with each other in a suitable manner without contradicting the processing contents.

First Exemplary Embodiment

[Constitution of Sensor Module 10]

Figure 2:
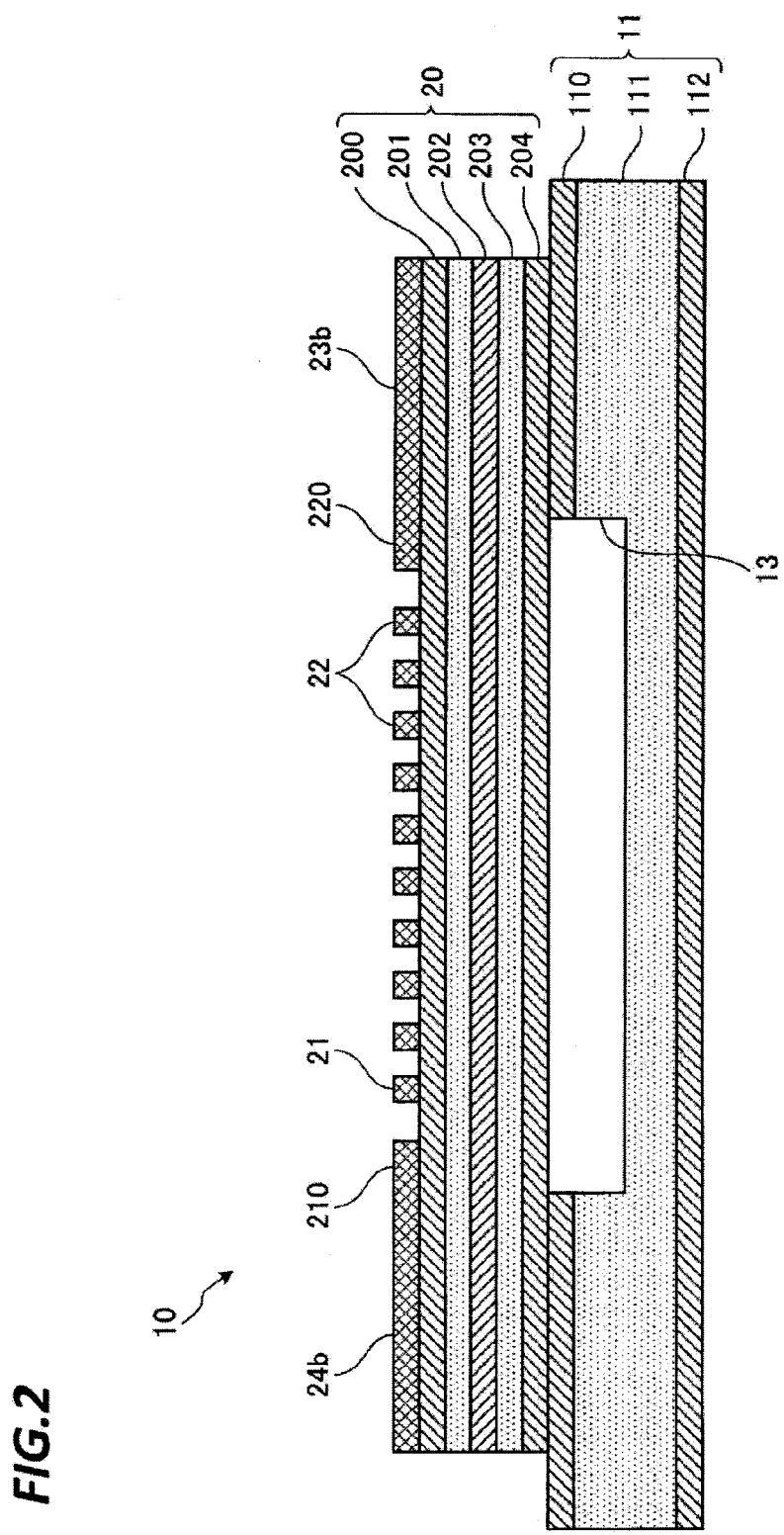
FIG. 2 is a cross-sectional view of the sensor module taken along line A-A in FIG. 1.
Figure 3:
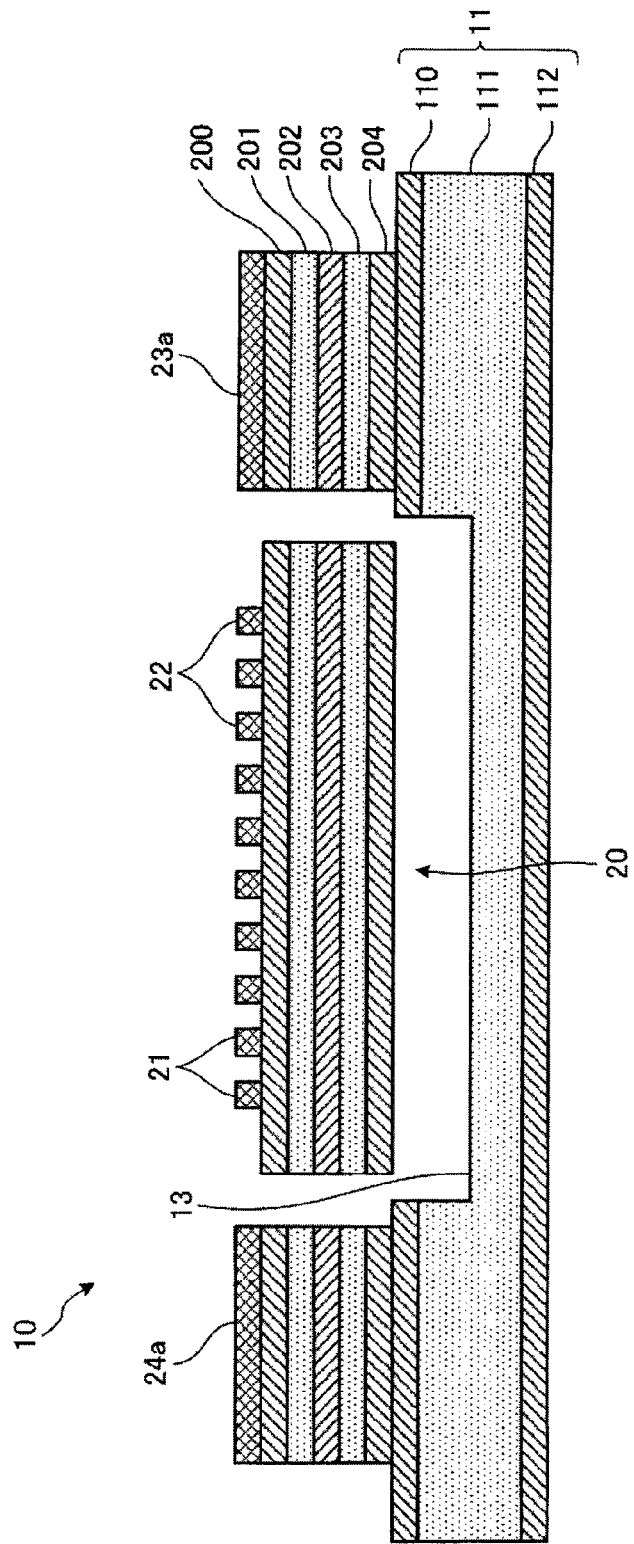
FIG. 3 is a section view of the sensor module taken along line B-B in FIG. 1.

FIG. 1 is a plan view of an exemplary sensor module 10 in a first exemplary embodiment. FIG. 2 is a section view of the sensor module 10 taken along line A-A in FIG. 1. FIG. 3 is a section view of the sensor module 10 taken along line B-B in FIG. 1.

The sensor module 10 includes a base substrate 11 including a recess 13 formed therein. On the base substrate 11, an electrode pad 12a, an electrode pad 12b, and a temperature compensation body 30 are formed. Also, a floating film 20 is formed on the base substrate 11 to extend across the recess 13 formed in the base substrate 11. On the floating film 20, a heater 21 and a temperature sensor 22 are formed. The sensor module 10 is an example of a pressure sensor.

For example, as illustrated in FIGS. 2 and 3, the base substrate 11 includes a protective layer 110, an intermediate layer 111, and a protective layer 112. The intermediate layer 111 is formed of, for example, silicon. The protective layers 110 and 112 are formed of, for example, silicon nitride. The recess 13 is formed approximately in the vicinity of the center of the base substrate 11 at the side of the surface on which the protective layer 110 is formed.

For example, as illustrated in FIGS. 2 and 3, the floating film 20 is formed on the base substrate 11 to extend across the recess 13. The floating film 20 is formed by laminating a protective layer 200, a heat transfer layer 201, an insulation layer 202, a heat transfer layer 203, and a protective layer 204. According to the present exemplary embodiment, the protective layers 200 and 204 are formed of, for example, silicon nitride. According to the present exemplary embodiment, the heat transfer layers 201 and 203 are formed of, for example, silicon. Further, the insulation layer 202 according to the present exemplary embodiment is formed of, for example, silicon oxide.

For example, as illustrated in FIGS. 2 and 3, the heater 21 and the temperature sensor 22 are formed in the form of a fine wire from a conductive member on the top surface of the protective layer 200. For example, as illustrated in FIGS. 2 and 3, electrode pads 23a and 23b, and an electrode pads 24a and 24b are formed of a conductive member on the top surface of the protective layer 200.

In the present exemplary embodiment, for example, as illustrated in FIG. 1, the heater 21 is disposed along the outer periphery of the floating film 20 to surround the temperature sensor 22 provided on the floating film 20. As a result, the heater 21 is able to heat the entire area of the floating film 20 more uniformly. As long as the entire area of the floating film 20 may be uniformly heated, the wiring pattern of the heater 21 on the floating film 20 may be formed in any other pattern such as, for example, a meander shape, a spiral shape, or a zigzag shape, without being limited to that illustrated in FIG. 1.

In the present exemplary embodiment, the heater 21 is formed of, for example, platinum. Meanwhile, the heater 21 may be formed of, for example, a material containing at least one of platinum, nickel, chromium, and tungsten.

According to the present exemplary embodiment, for example, as illustrated in FIG. 1, the temperature sensor 22 may be formed in a meander shape in which the linear temperature sensor 22 is bent multiple times in a direction different from the direction from the electrode pad 23a to the electrode pad 24a as the linear temperature sensor proceeds in the direction from the electrode pad 23a to the electrode pad 24a. As a result, the surface of the temperature sensor 22 to be in contact with the floating film 20 may be increased so that the temperature change caused in the floating film 20 by heat exchange with the gas may be detected highly precisely. As long as it is possible to detect a temperature change over the entire area of the floating film 20, the wiring pattern of the temperature sensor 22 on the floating film 20 may be formed in any other pattern without being limited to that illustrated in FIG. 1.

In the present exemplary embodiment, the temperature sensor 22 is formed of, for example, a material having a high temperature coefficient of resistance (TCR) such as for example, platinum or nickel, in which the TCR refers to a change amount of electric resistance per a unit temperature change. The temperature sensor 22 may also be formed of chromium, silicon, molybdenum, nickel, titanium, tantalum, tungsten, or a quantum well material such as, for example, a conductive alloy, a mixed semiconductor material, or a silicon germanium (SiGe) single crystal. Meanwhile, an adhesive layer, formed of, for example, chromium or titanium, may be provided between the temperature sensor 22 and the protective layer 200.

In the present exemplary embodiment, the heater 21, the temperature sensor 22, the electrode pad 23a, the electrode pad 23b, the electrode pad 24a, and the electrode pad 24b are laminated on the protective layer 200 through a sputtering under a temperature condition of, for example, 50° C. or less, and are formed into a predetermined pattern through, for example, a reactive ion etching (RIE) or a milling.

One end of the temperature sensor 22 is connected to the electrode pad 23a via a wiring 220 on the floating film 20 and the other end is connected to the electrode pad 23b via a wiring 220 on the floating film 20. Further, one end of the heater 21 is to the electrode pad 24a via a wiring 210 on the floating film 20 and the other end is connected to the electrode pad 24b via a wiring 210 on the floating film 20.

For example, as illustrated in FIGS. 1 and 2, the floating film 20 is supported on the base substrate 11 by the portion of the floating film 20, on which the wiring 210 is provided, and the portion of the floating film 20, on which the wiring 220 is provided. The portion of the floating film 20, on which the heater 21 and the temperature sensor 22 are provided, is provided above the recess 13 and spaced apart from the base substrate 11. As a result, the transfer amount of heat between the portion of the floating film 20, on which the heater 21 and the temperature sensor 22 are provided, and the base substrate 11 may be kept low. Also, the portion of the floating film 20, on which the heater 21 and the temperature sensor 22 are provided, is exposed to the gas, thereby performing most of the heat exchange with the gas.

The heater 21 generates heat as the current is supplied thereto through the electrode pad 24a and the electrode pad 24b, thereby heating the floating film 20. In the present exemplary embodiment, the floating film 20 is heated as a current of several mA (e.g., 2.4 mA) flows in the heater 21 to generate heat. In the present exemplary embodiment, the heat transfer layer 201 provided on the floating film 20 is formed of silicon having a high thermal conductivity, and has a function of uniformizing the temperature of the floating film by conducting the heat applied to the floating film 20 from the heater 21 to the entire area of the floating film 20.

The temperature sensor 22 outputs the resistance thereof according to the temperature of the floating film 20 as a voltage drop across the temperature sensor 22. In the present exemplary embodiment, the resistance of the temperature sensor 22 is determined based on the voltage drop across the temperature sensor 22 by causing a current less than that flowing in the heater 21 to flow in the temperature sensor 22, and the temperature of the floating film 20 is determined based on the resistance of the temperature sensor 22. In the present exemplary embodiment, a current flowing in the temperature sensor 22 ranges from $1/30$ times to $1/5$ times the current flowing in the heater 21 (e.g., 0.1 mA).

Figure 4:
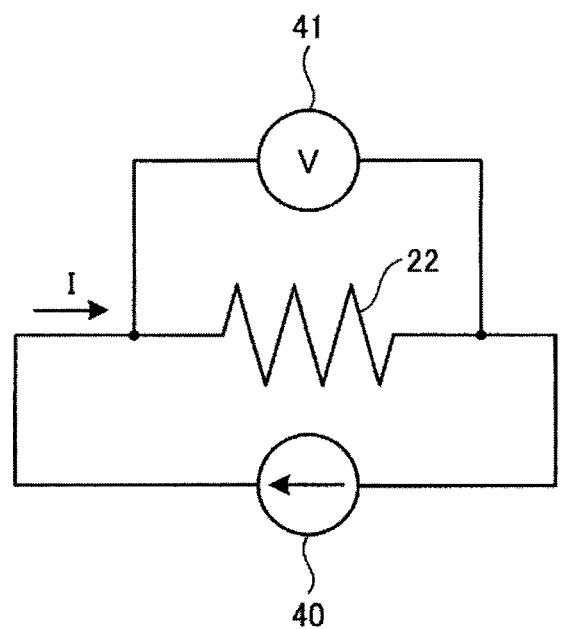
FIG. 4 is a circuit diagram illustrating an exemplary method for measuring a pressure.

Here, when the gas comes in contact with the floating film 20 heated by the heater 21, the floating film 20 exchanges heat with the gas so that the temperature of the floating film 20 decreases. When the temperature of the floating film 20 decreases, the temperature of the temperature sensor 22 on the floating film 20 also decreases. Since the resistance of the temperature sensor 22 depends on the temperature, the temperature of the temperature sensor 22 may be measured as the resistance value of the temperature sensor 22. Also, when a predetermined current (e.g., 0.1 mA) is caused to flow in the temperature sensor 22 by a current source 40 using a measuring circuit, for example, as illustrated in FIG. 4, the resistance of the temperature sensor 22 may be measured as a voltage drop across the temperature sensor 22 by a voltage gauge 41.

When the pressure of a gas is low, the heat quantity taken out by the gas from the floating film 20 is reduced, and thus, the decreasing amount of temperature of the floating film 20 and the temperature sensor 22 is small. Meanwhile, when the pressure of a gas is high, the heat quantity taken out by the gas from the floating film 20 is increased and thus, the decreasing amount of temperature of the floating film 20 and the temperature sensor 22 is increased. Therefore, the pressure of the gas can be measured by measuring the resistance according to the temperature of the temperature sensor 22.

In the Pirani vacuum gauge, the pressure of a gas is determined by heating an electrical resistor made of a fine metal wire and then measuring a temperature change caused in the electrical resistor by the heat exchange between the electrical resistor and the gas, as a resistance change in the electrical resistor. Further, when manufacturing a small Pirani vacuum gauge, the electrical resistor that exchanges heat with the gas is generally formed on a substrate through a normal-temperature sputtering.

The electrical resistor formed through the normal-temperature sputtering has a low deposition temperature, and thus, an atom that has reached the substrate hardly grows into a crystal nucleus. Thus, the electrical resistor formed through the normal-temperature sputtering becomes a film having small crystals and a lot of voids.

Thus, when a current flows in the electrical resistor formed through the normal-temperature sputtering, voids in the electrical resistor grow, and thus the resistance of the electrical resistor is changed. In the Pirani vacuum gauge, it is necessary to heat the electrical resistor, and thus, a relatively large current is caused to flow in the electrical resistor. When the current flowing in the electrical resistor is increased, the growth of voids in the electrical resistor is also increased, and thus, the change amount of the resistance is also increased.

In the Pirani vacuum gauge, the pressure of a gas is determined based on the resistance corresponding to the temperature of the electrical resistor. Thus, when the resistance of the electrical resistor is changed with the growth of voids in the electrical resistor, the precision of measuring the heat quantity generated according to a gas pressure is degraded, and thus, the precision of measuring the pressure of the gas is also degraded.

Thus, in the present exemplary embodiment, the function of the electrical resistor in the Pirani vacuum gauge is divided into two functions of heating and temperature measuring in which the heating function is implemented with the heater 21 and the temperature measuring function is implemented with the temperature sensor 22. Further, a large current required for heating (e.g., 2.4 mA) is input to the heater 21 and a very small current for measuring the resistance (e.g., 0.1 mA) is input to the temperature sensor 22.

Thus, even when the temperature sensor 22 is formed through the normal-temperature sputtering, the growth of voids in the temperature sensor 22 is small since the current flowing in the temperature sensor 22 is small. As a result, the resistance change caused by the current flowing in the temperature sensor 22 is also small. Thus, the temperature of the floating film 20 may be measured highly precisely. Therefore, it is possible to provide a sensor module 10 which is small in size but excellent in precision of measuring a pressure of a gas.

The sensor module 10 is provided with a temperature compensation body 30 between the electrode pad 12a and the electrode pad 12b on the base substrate 11, for example, as illustrated in FIG. 1. The temperature compensation body 30 is provided to compensate for an effect caused by the temperature change in the base substrate 11. The temperature compensation body 30 is formed on the surface of the base substrate 11 in the vicinity of the floating film 20. The temperature compensation body 30 is formed in a fine wire shape from the same material as the temperature sensor 22. The temperature compensation body 30 is formed, for example, in a meander shape on the surface of the base substrate 11. The temperature compensation body 30 is covered with a passivation layer such that the surface of the base substrate 30 is not exposed to the gas.

[Manufacturing Sequence of Sensor Module 10]

Figure 5:
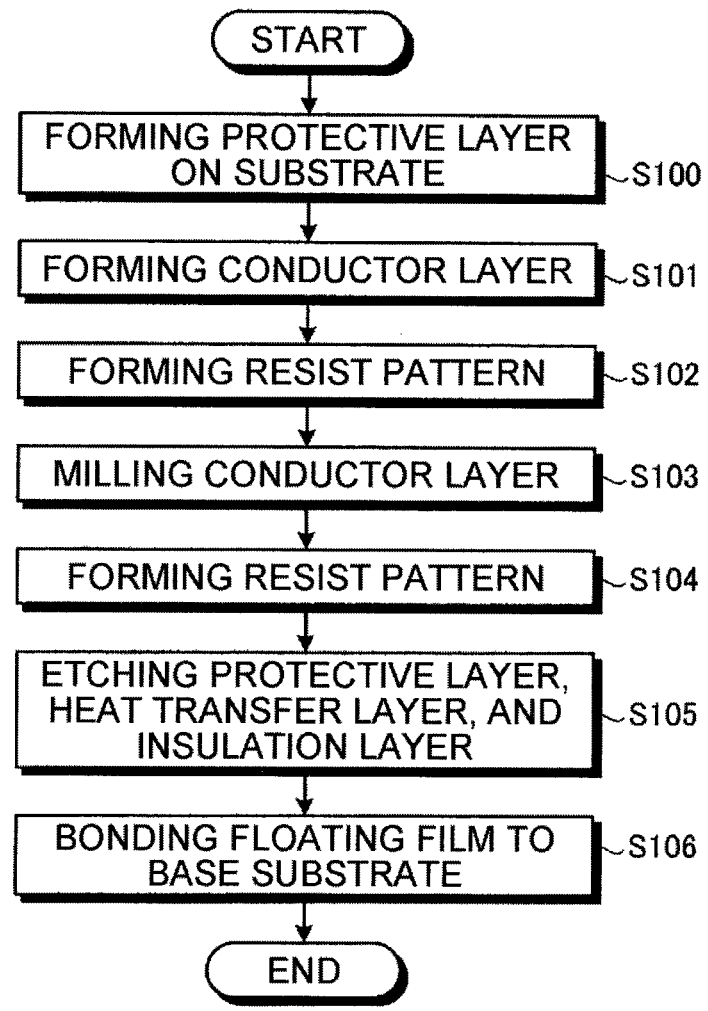
FIG. 5 is a flowchart illustrating an exemplary manufacturing sequence for the sensor module in the first exemplary embodiment.
Figure 6:
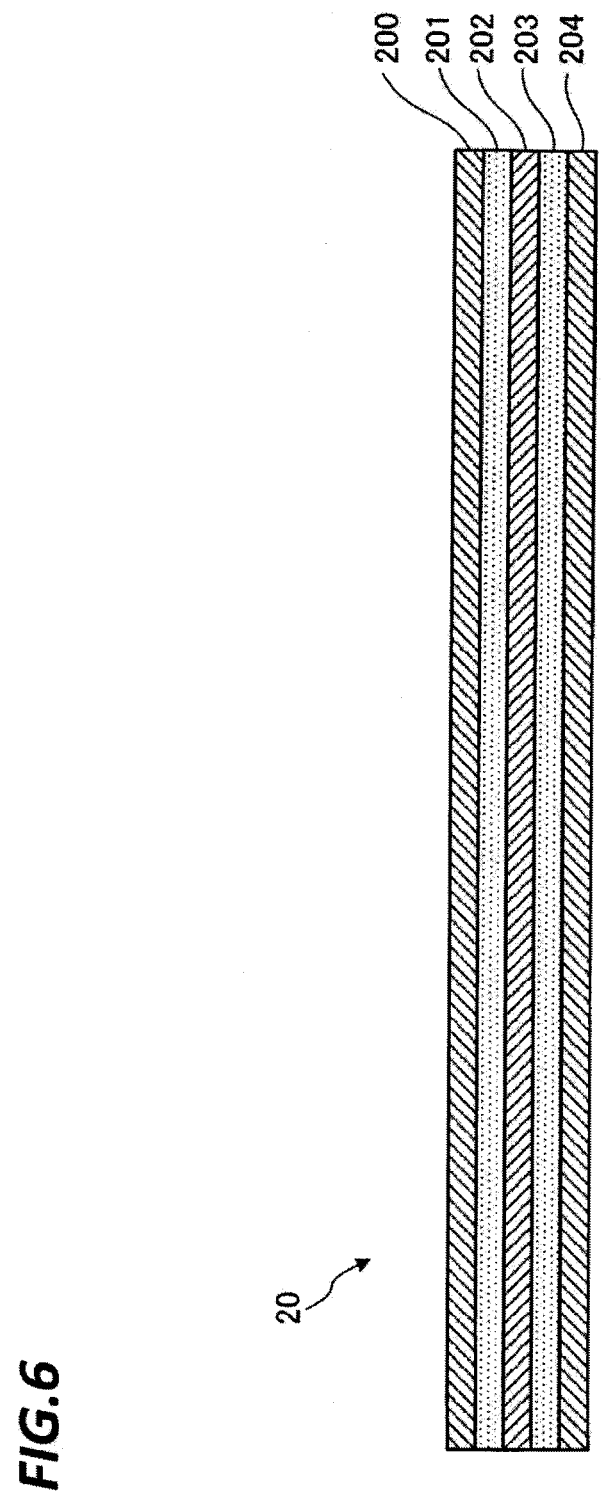
FIG. 6 is a cross-sectional view illustrating an exemplary floating film in a process of manufacture.
Figure 7:
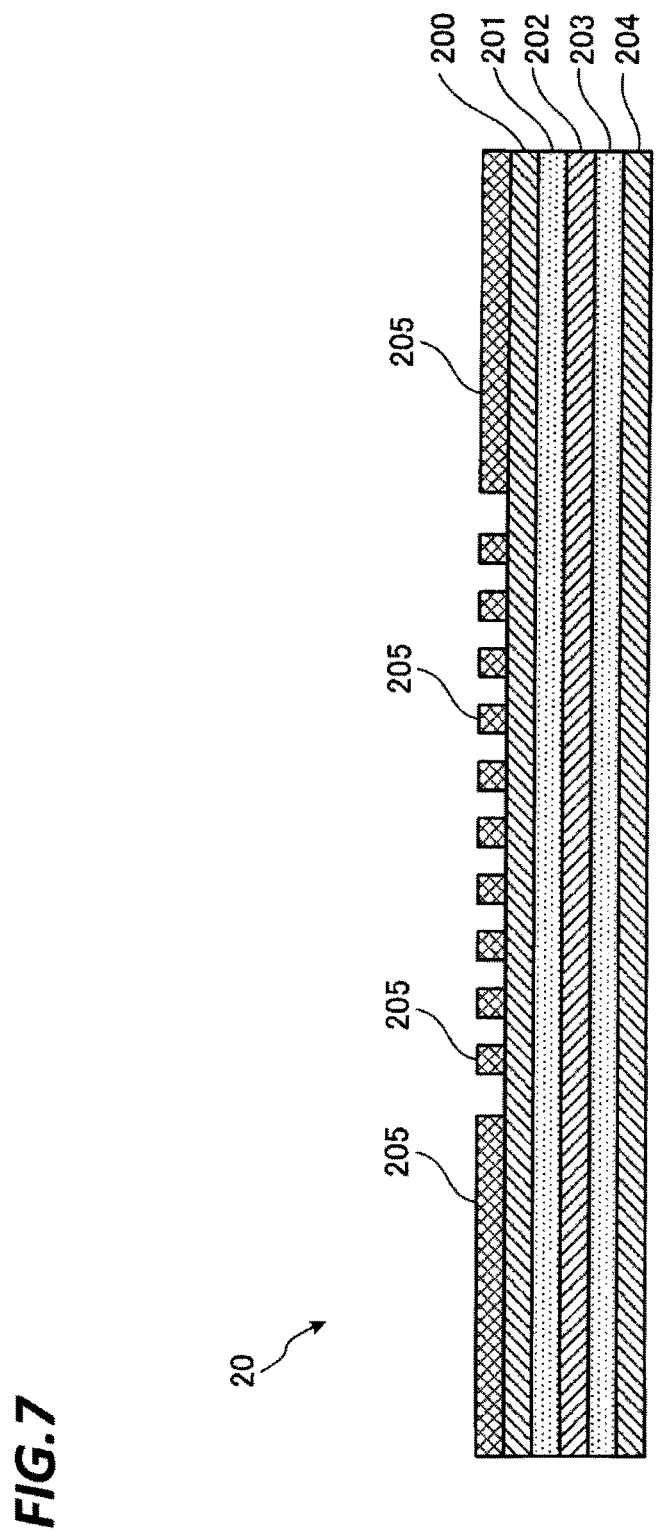
FIG. 7 is a section view illustrating an exemplary floating film in a process of manufacture.
Figure 8:
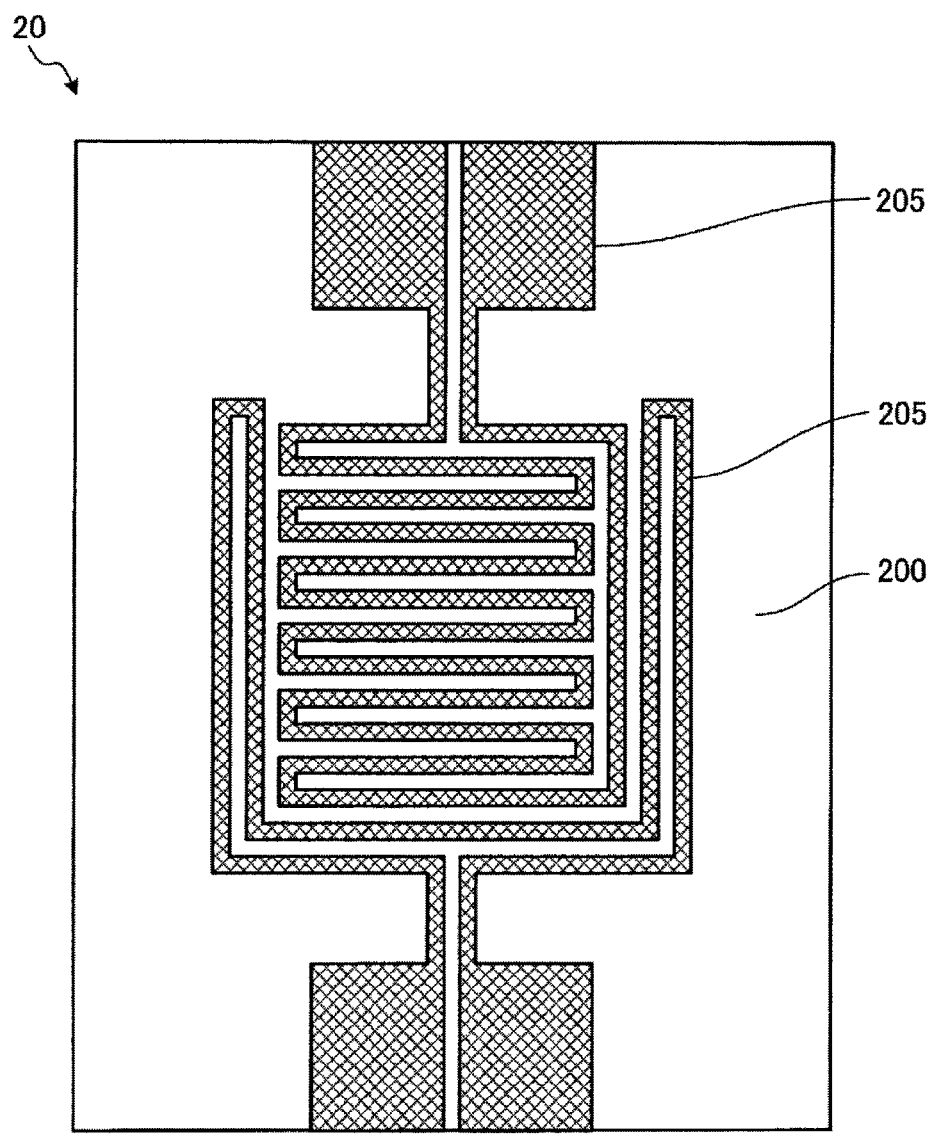
FIG. 8 is a plan view illustrating an exemplary pattern of a conductor layer.
Figure 9:
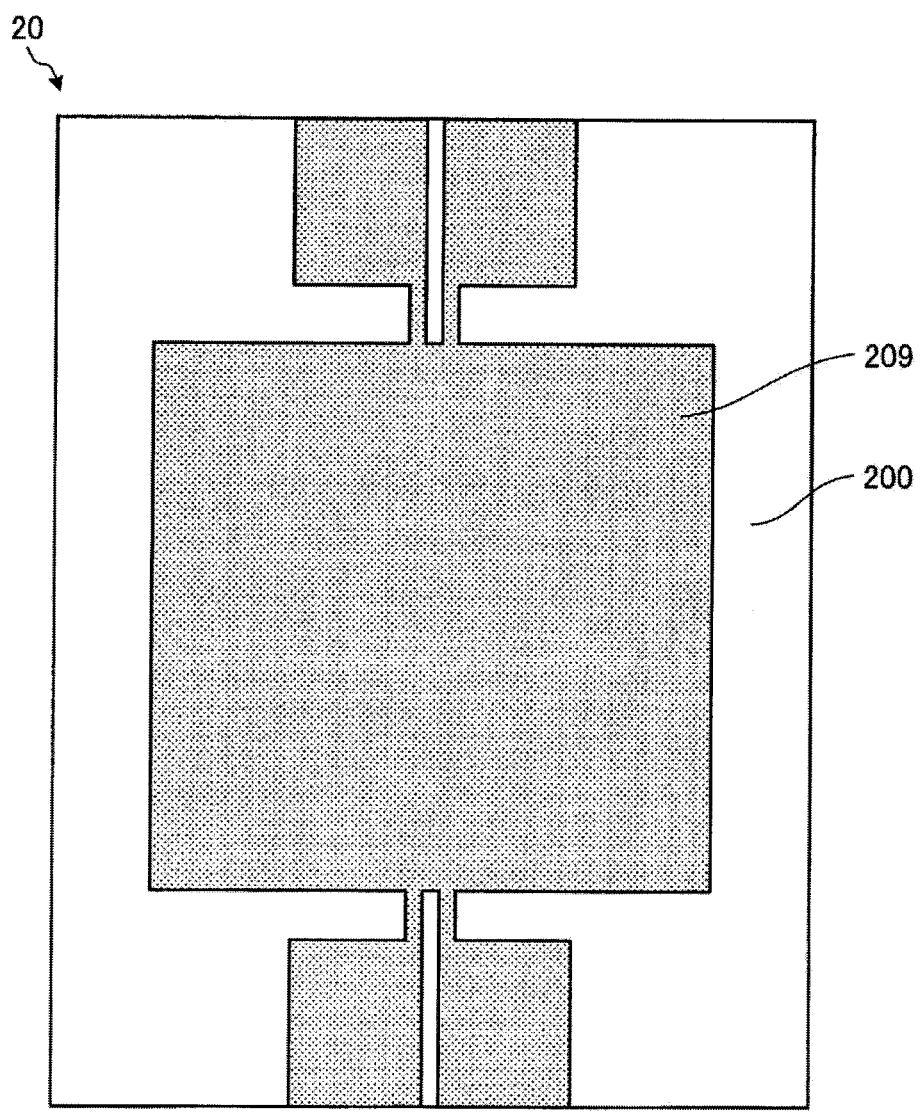
FIG. 9 is a plan view illustrating an exemplary resist pattern.

FIG. 5 is a flowchart illustrating an exemplary manufacturing sequence of a sensor module 10 in a first exemplary embodiment. FIGS. 6 to 7 are cross-sectional section views illustrating an exemplary floating film in the process of manufacture. FIG. 8 is a plan view illustrating an exemplary pattern of the conductor layer 205. FIG. 9 is a plan view illustrating an exemplary resist pattern 209.

First, for example, as illustrated in FIG. 6, a protective layer 200 and a protective layer 204 are respectively formed on both sides of a substrate that includes an insulation layer 202 interposed between a heat transfer layer 201 and a heat transfer layer 203 (S100). As for the substrate including the insulation layer 202 interposed between the heat transfer layer 201 and the heat transfer layer 203, for example, an SOI (Silicon On Insulator) substrate may be used. Also, in the present exemplary embodiment, the protective layers 200 and 204 made of silicon nitride are, respectively, formed on both sides of the SOI substrate through, for example, a sputtering.

Then, on the protective layer 200, a conductor layer 205 is formed of a conductive material through, for example, a normal-temperature sputtering. Also, on the conductor layer 205, resist patterns corresponding to the heater 21, the temperature sensor 22, the electrode pad 23a, the electrode pad 23b, the electrode pad 24a, and the electrode pad 24b are formed (S102).

Then, the portion of the conductor layer 205, which is not covered by the resist patterns, is removed through a milling by irradiation of, for example, argon ions (S103). As a result, for example, as illustrated in FIGS. 7 and 8, on the protective layer 200, the conductor layer 205 is formed in the shapes of the heater 21, the temperature sensor 22, the electrode pad 23a, the electrode pad 23b, the electrode pad 24a, and the electrode pad 24b.

Then, for example, as illustrated in FIG. 9, a resist pattern 209 is formed on a floating film 20 to leave the portion of the floating film 20, on which the heater 21 and the temperature sensor 22 are placed, and the portions of the floating film 20, on which the electrode pad 23a, the electrode pad 23b, the electrode pad 24a, and the electrode pad 24b are placed (S104).

Figure 10:
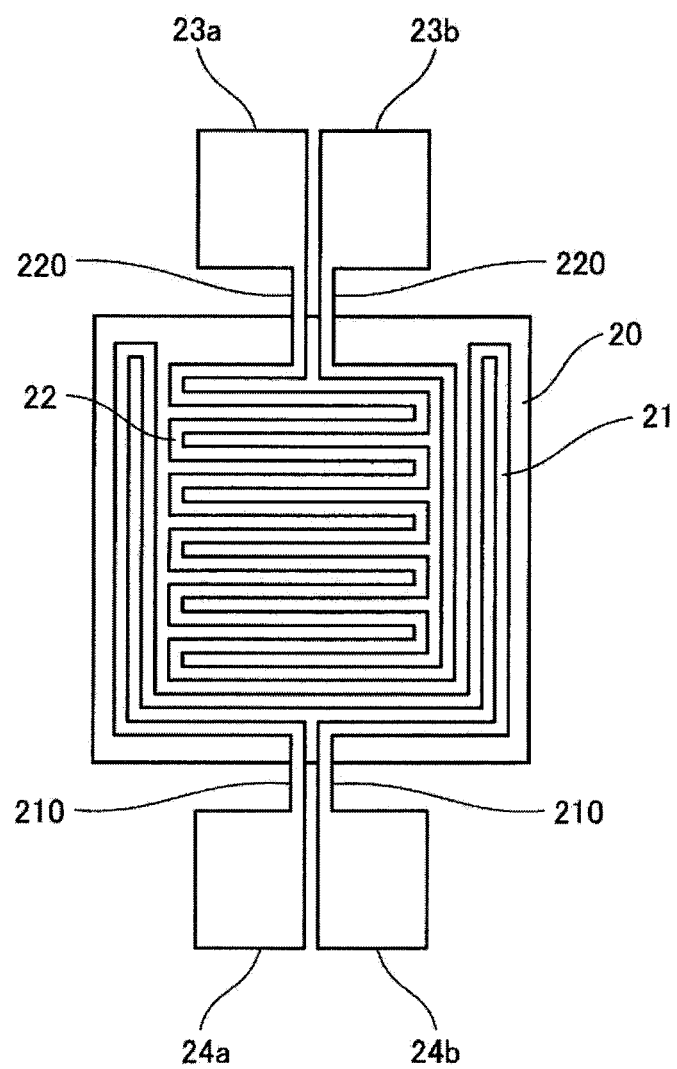
FIG. 10 is a plan view illustrating an exemplary floating film in the first exemplary embodiment.

Then, the protective layer 200, the heat transfer layer 201, the insulation layer 202, the heat transfer layer 203, and the protective layer 204 in the floating film 20 formed with the resist pattern 209 are etched through, for example, an RIE (S105). Thus, the portion of the floating film 20 uncovered by the resist pattern 209 is removed so that a floating film 20, for example, as illustrated in FIG. 10 is formed. FIG. 10 is a plan view illustrating an exemplary floating film in the first exemplary embodiment.

Figure 11:
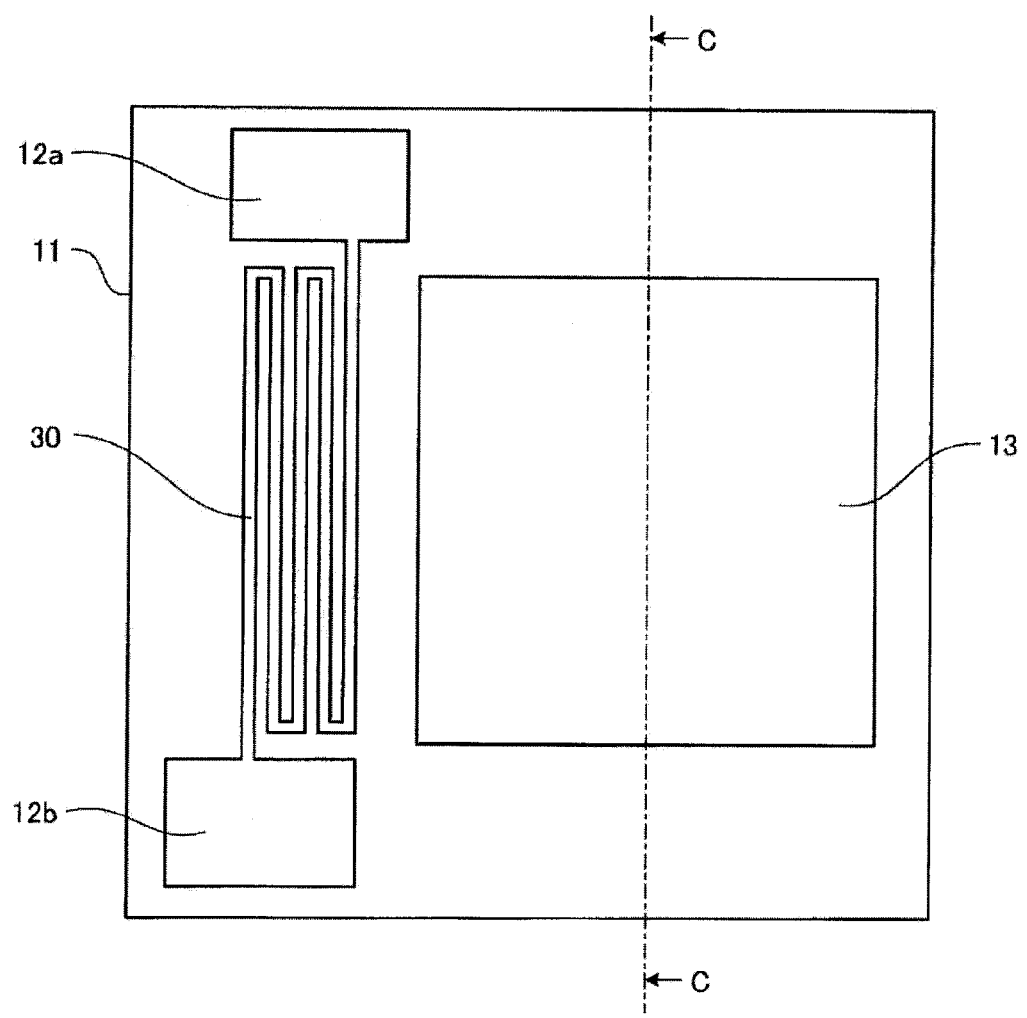
FIG. 11 is a plan view illustrating an exemplary base substrate in the first exemplary embodiment.
Figure 12:
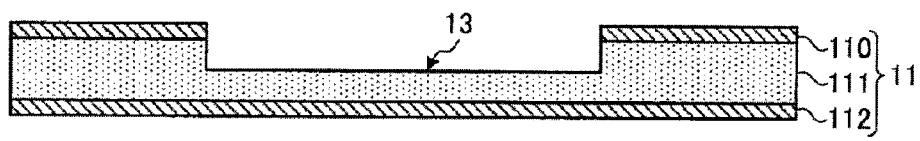
FIG. 12 is a cross-sectional view of the base substrate taken along line C-C in FIG. 11.

Then, for example, as illustrated in FIG. 11, a base substrate 11 including a surface, on which an electrode pad 12a, an electrode pad 12b, a recess 13, and a temperature compensation body 30, is provided. For example, as illustrated in the cross-sectional view of FIG. 12, the base substrate 11 includes an intermediate layer 111, protective layers 110 and 112 formed on the opposite surfaces of the intermediate layer 111, respectively, and a recess 13 formed at side of the protective layer 110. The intermediate layer 111 is made of, for example, silicon, and the protective layers 110 and 112 are made of, for example, silicon nitride.

Also, the floating film 20 formed through the processes of steps S100 to S105 is disposed on the base substrate 11 to extend across the recess 13 of the base substrate 11 and bonded thereto (S106). In this case, the floating film 20 is bonded to the base substrate 11 such that the surface of the floating film 20 opposite to the surface, on which the heater 21 and the temperature sensor 22 are formed, faces the recess 13 formed in the base substrate 11. As a result, the sensor module 10 illustrated in FIGS. 1 to 3 is manufactured.

In the foregoing, the first exemplary embodiment has been described. The sensor module 10 of the present exemplary embodiment is able to increase the precision of measuring a pressure of a gas.

Second Exemplary Embodiment

Hereinafter, a second exemplary embodiment will be described. A sensor module 10 in the second exemplary embodiment is different from that in the first exemplary embodiment in that a heater 21 and a temperature sensor 22 are formed on different surfaces of a floating film 20, respectively. In the sensor module 10 of the second exemplary embodiment, the same elements as those in the first exemplary embodiment will be denoted by the same symbols, and detailed descriptions thereof other than the following description will be omitted.

[Constitution of Sensor Module 10]

Figure 13:
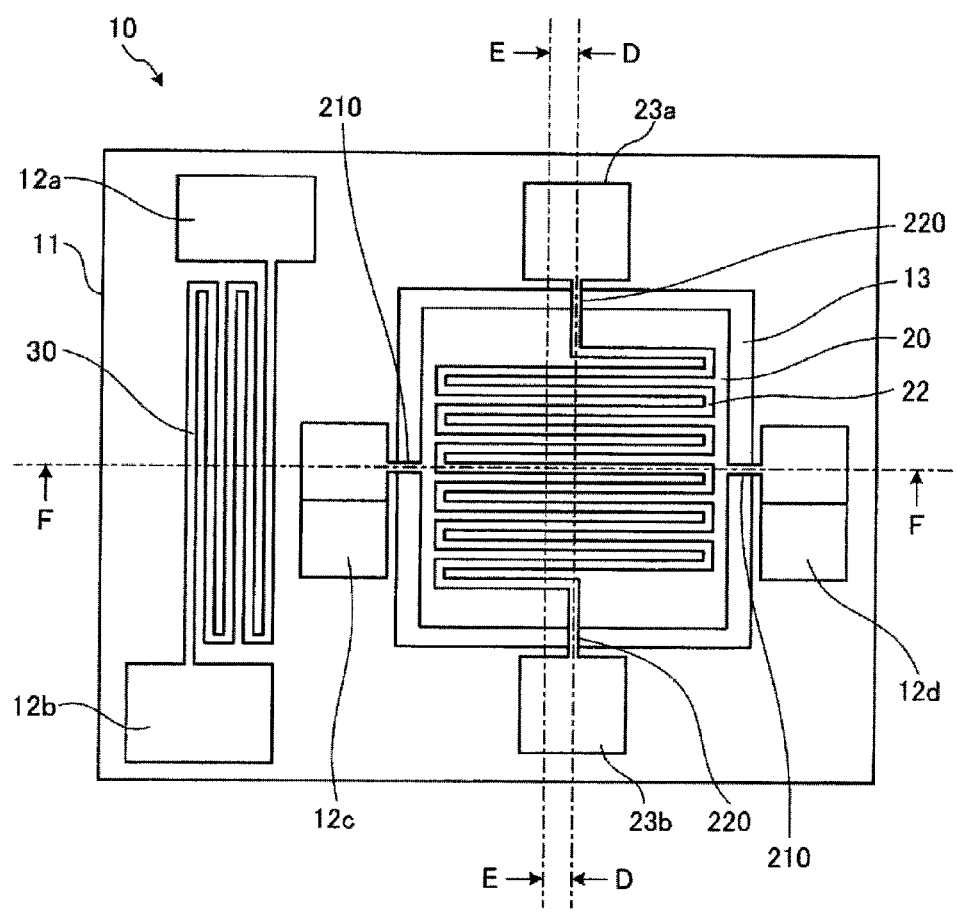
FIG. 13 is a plan view illustrating an exemplary sensor module in a second exemplary embodiment.
Figure 14:
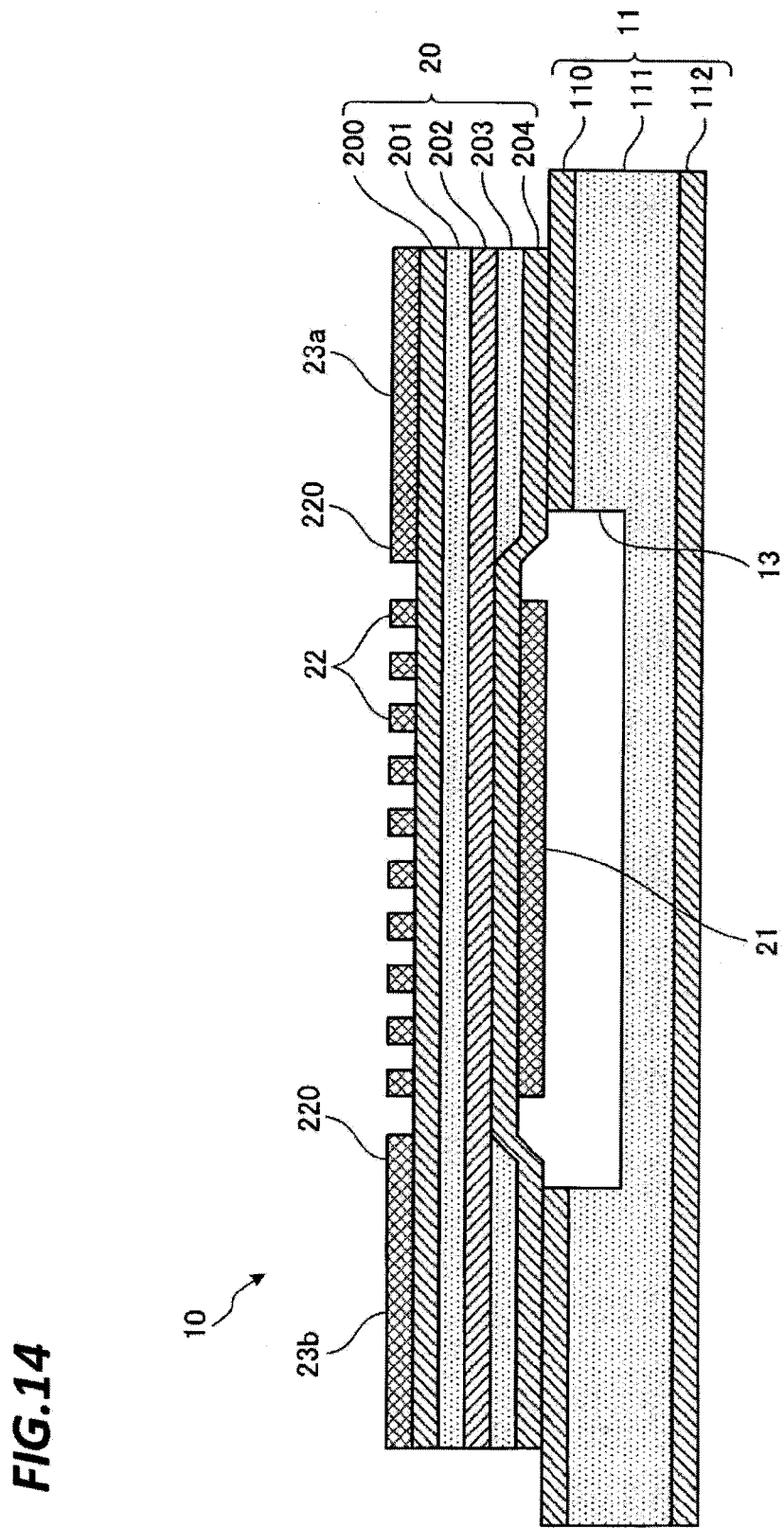
FIG. 14 is a cross-sectional view of the sensor module taken along line D-D in FIG. 13.
Figure 15:
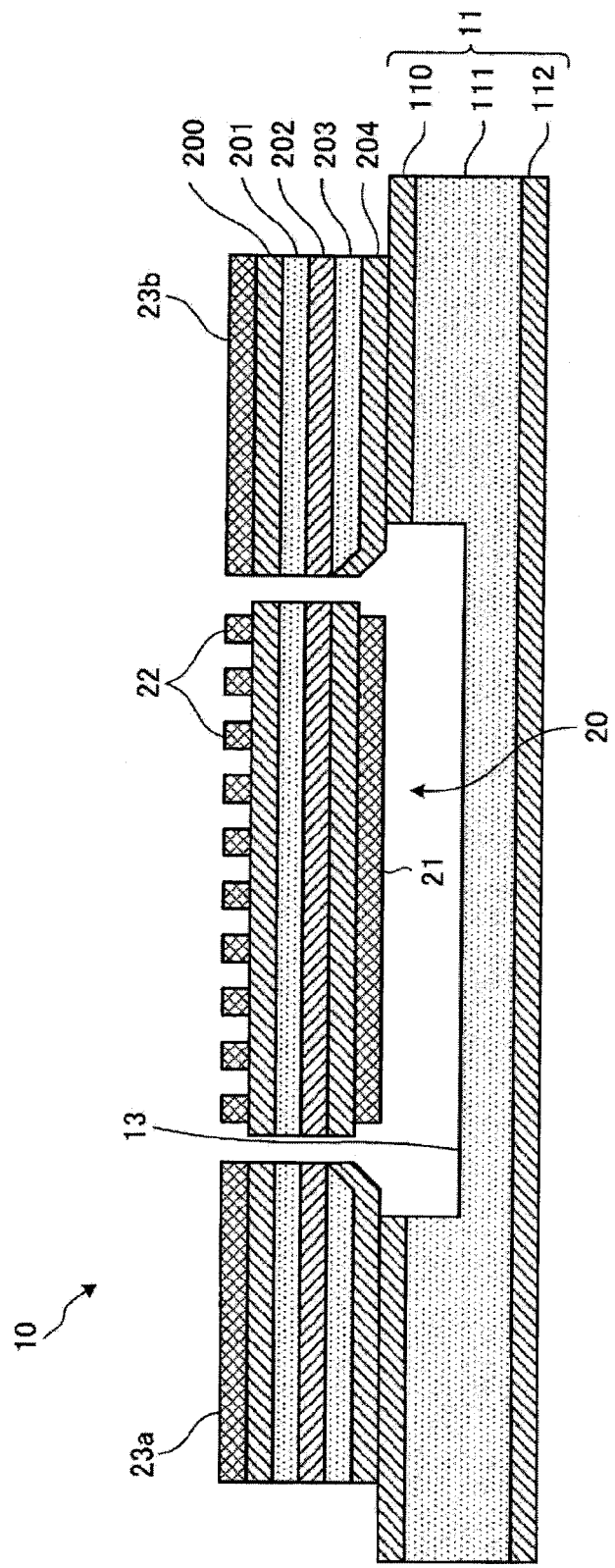
FIG. 15 is a cross-sectional view of the sensor module taken along line E-E in FIG. 13.
Figure 16:
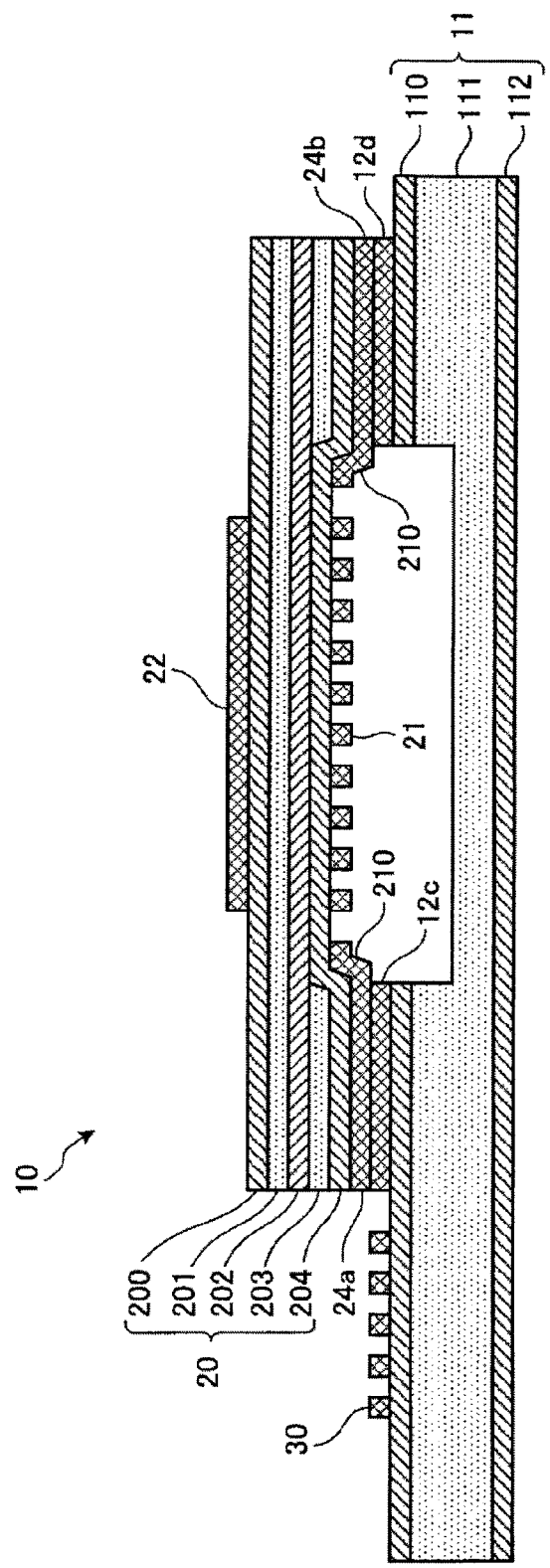
FIG. 16 is a cross-sectional view of the sensor module taken along line F-F in FIG. 13.

FIG. 13 is a plan view illustrating an exemplary sensor module 10 in the second exemplary embodiment. FIG. 14 is a cross-sectional view of the sensor module 10 taken along line D-D of FIG. 13. FIG. 15 is a cross-sectional view of the sensor module 10 taken along line E-E of FIG. 13. FIG. 16 is a cross-sectional view of the sensor module 10 taken along line F-F of FIG. 13.

The sensor module 10 includes a base substrate 11 including a recess 13 formed therein. On the base substrate 11, a plurality of electrode pads 12a to 12d and a temperature compensation body 30 are formed. Also, on the base substrate 11, a floating film 20 is formed to extend across the recess 13 of the base substrate 11. A heater 21 and a temperature sensor 22 are formed on the floating film 20.

The floating film 20 is formed on the base substrate 11 to extend across the recess 13, for example, as illustrated in FIGS. 14 to 16. The floating film 20 is formed by laminating a protective layer 200, a heat transfer layer 201, an insulation layer 202, a heat transfer layer 203, and a protective layer 204. On the top surface of the protective layer 200, a temperature sensor 20, an electrode pad 23a, and an electrode pad 23b are provided, for example, as illustrated in FIGS. 14 to 16.

Figure 24:
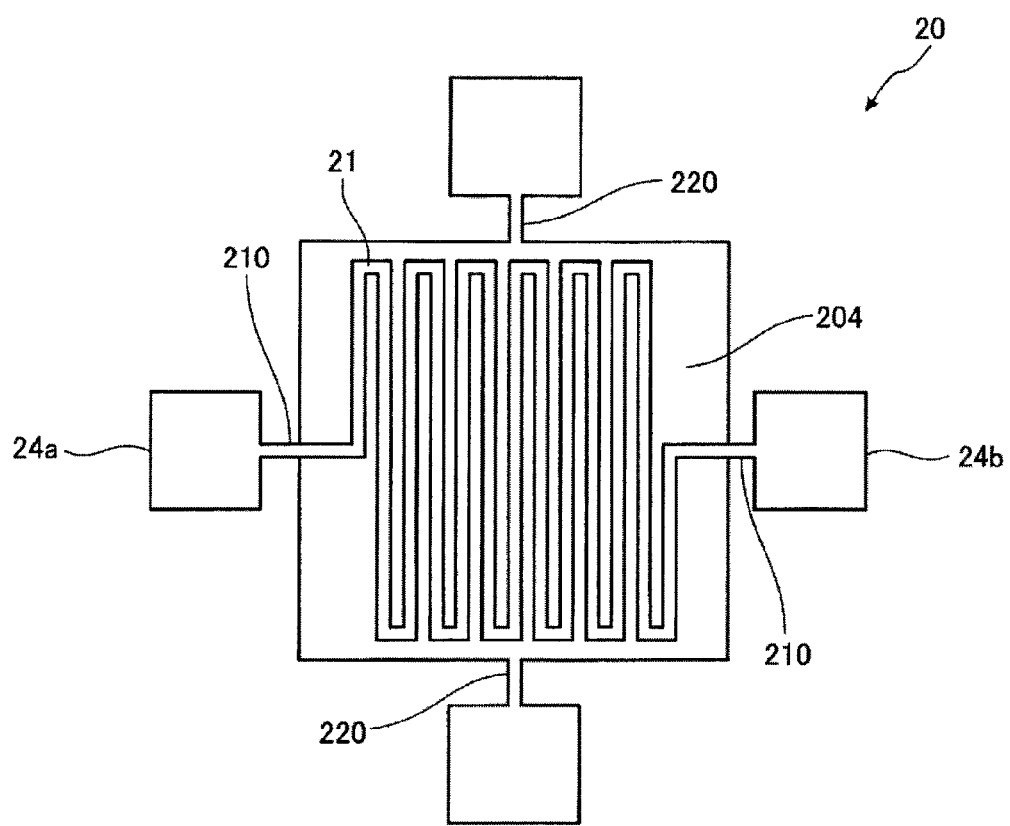
FIG. 24 is a plan view illustrating an exemplary floating film in the second exemplary embodiment.

In the present exemplary embodiment, the temperature sensor 22 may be formed, for example, in a meander shape on the protective layer 200 of the floating film 20, for example, as illustrated in FIGS. 13 to 16. As a result, the surface of the temperature sensor 22 to be in contact with the floating film 20 may be increased so that a temperature change caused in the floating film 20 by heat exchange with a gas can be detected highly precisely. Meanwhile, in the present exemplary embodiment, the heater 21 is formed, for example, in a meander shape on that surface of the floating film 20 at the side of the protective layer 204, as illustrated in FIG. 24 described below. As a result, the heater 21 is able to heat the entire area of the floating film more uniformly.

In the present exemplary embodiment, the temperature sensor 22, the electrode pad 23a, and the electrode pad 23b are formed on the protective layer 200 through, for example, a normal-temperature sputtering under the temperature condition of, for example, 50° C. or less. Also, in the present exemplary embodiment, the heater 21, the electrode pad 24a, and the electrode pad 24b are formed on the protective layer 204 through, for example, a normal-temperature sputtering under the temperature condition of 50° C. or less.

One end of the temperature sensor 22 is connected to the electrode pad 23a via a wiring 220 formed on the protective layer 200 and the other end is connected to the electrode pad 23b via the wiring 220 formed on the protective layer 200. Further, one end of the heater 21 is connected to the electrode pad 24a via a wiring 210 formed on the protective 204, and the other end is connected to the electrode pad 24b via a wiring 210 formed on the protective layer 204.

The electrode pad 24a is bonded to an electrode pad 12c by, for example, a conductive adhesive, for example, as illustrated in FIG. 16. The electrode pad 24b is bonded to an electrode pad 12d by, for example, a conductive adhesive, for example, as illustrated in FIG. 16.

As illustrated in FIGS. 13 to 16, the floating film 20 is supported on the base substrate 11 through the portion of the floating film 20, on which the wiring 210 is provided, and the portion of the floating film 20, on which the wiring 220 is provided. The portion of the floating film 20, on which the heater 21 and the temperature sensor 22 are provided, is provided above the recess 13 and spaced apart from the base substrate 11. As a result, the transfer amount of heat between the portion of the floating film 20, on which the heater 21 and the temperature sensor 22 are provided, and the base substrate 11 may be kept low. Also, the portion of the floating film 20, on which the heater 21 and the temperature sensor 22 are provided, is adapted to be exposed to a gas, thereby exchanging most of heat with the gas.

The heater 21 is formed on the surface of the floating film 20 at the recess 13 side, and generates heat by a current supplied through the electrode pad 24a and the electrode pad 24b to heat the floating film 20. The temperature sensor 22 outputs the resistance thereof according to the temperature of the floating film, as a voltage drop across the temperature sensor 22.

As in the sensor module 10 in the first exemplary embodiment, in the sensor module 10 of the present exemplary embodiment, a large current required for heating (2.4 mA) is input to the heater 21 and a very small current for measuring the resistance (0.1 mA) is input to the temperature sensor 22. As a result, even if the temperature sensor 22 was formed through a normal-temperature sputtering, the change amount of the resistance of the temperature sensor 22 is small, and thus, the temperature of the floating film may be measured more precisely. Accordingly, it is possible to provide a sensor module 10 which is small but excellent in precision of measuring a pressure of a gas.

[Manufacturing Sequence of Sensor Module 10]

Figure 17:
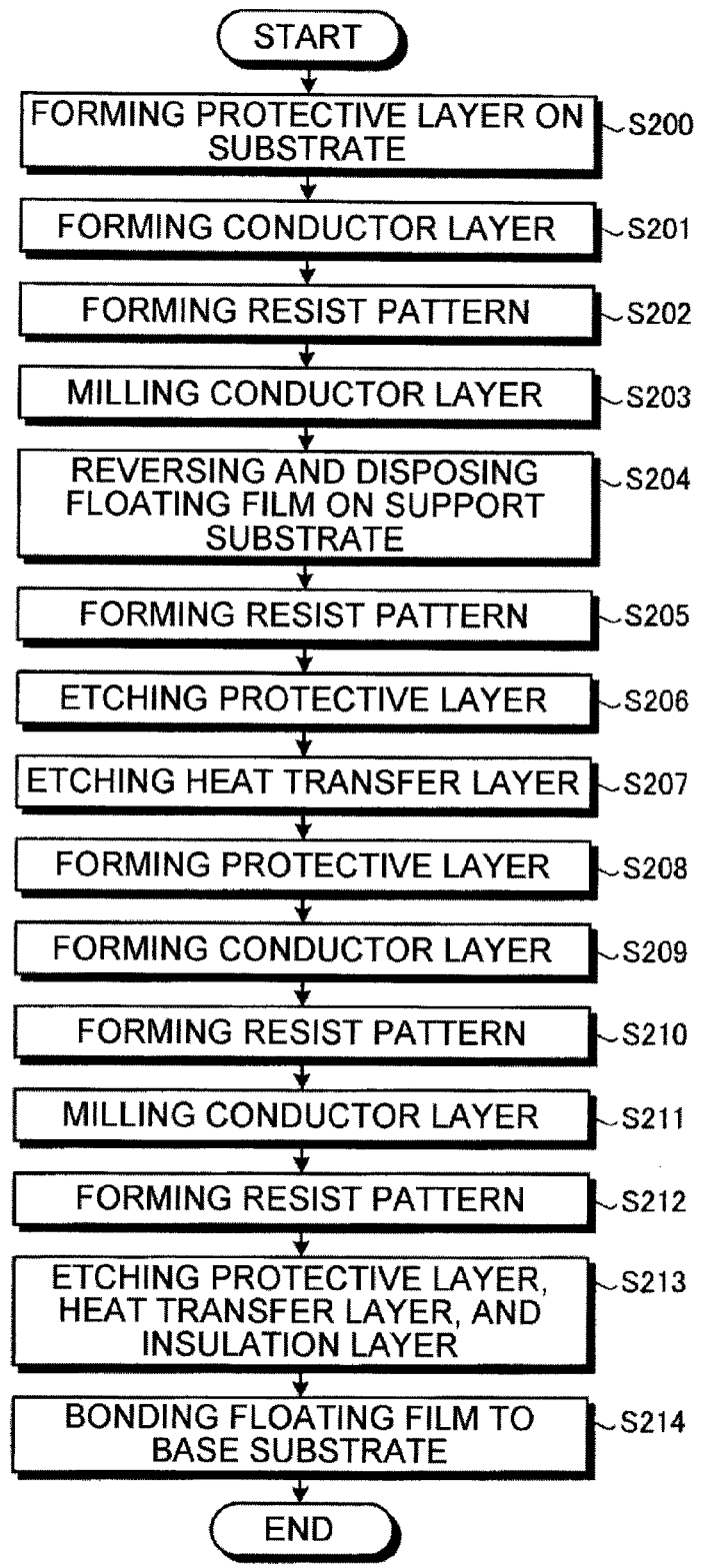
FIG. 17 is a flowchart illustrating an exemplary manufacturing sequence for the sensor module in the second exemplary embodiment.

FIG. 17 is a flowchart illustrating an exemplary manufacturing sequence of the sensor module 10 in the second exemplary embodiment. FIGS. 18 to 22 are cross-sectional views of an exemplary floating film 20 in the process of manufacture.

The processes of steps S200 to S203 are the same as those in the manufacturing sequence of the sensor module 10 in the first exemplary embodiment described with reference to FIG. 5, and thus, the descriptions thereof will be omitted. By performing the processes of steps S200 to S203, a floating film 20 is manufactured, for example, as illustrated in FIG. 7.

Figure 18:
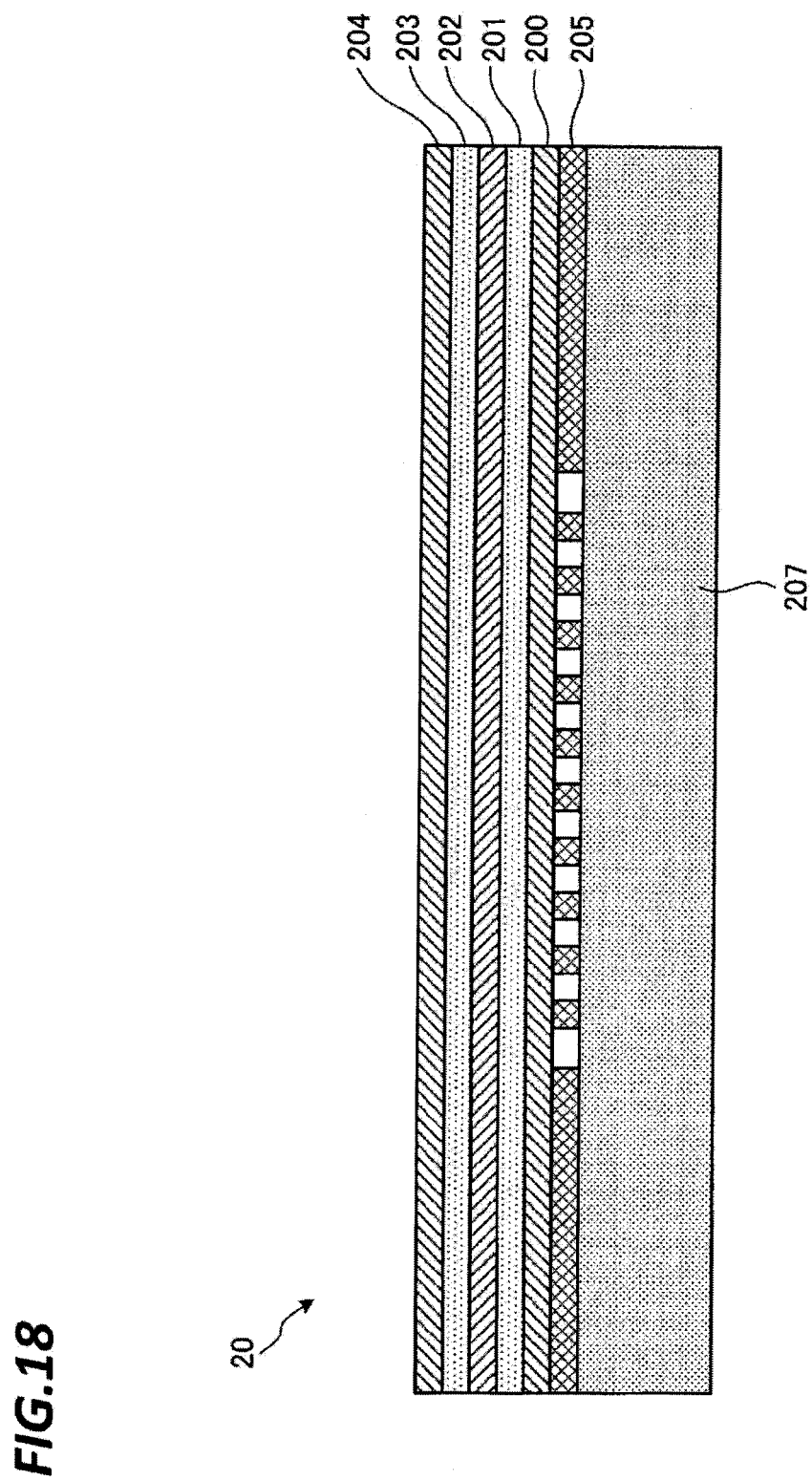
FIG. 18 is a cross-sectional view illustrating an exemplary floating film in the process of manufacture.

Then, the floating film 20 illustrated in FIG. 7 is reversed, and the reversed floating film 20 is disposed on a support substrate 207, for example, as illustrated in FIG. 18. Meanwhile, for example, wax may be coated on the support substrate 207 so as to cause the floating film 20 to adhere to the support substrate 207 so that the floating film 20 is not moved in the process of manufacturing the floating film 20.

Figure 19:
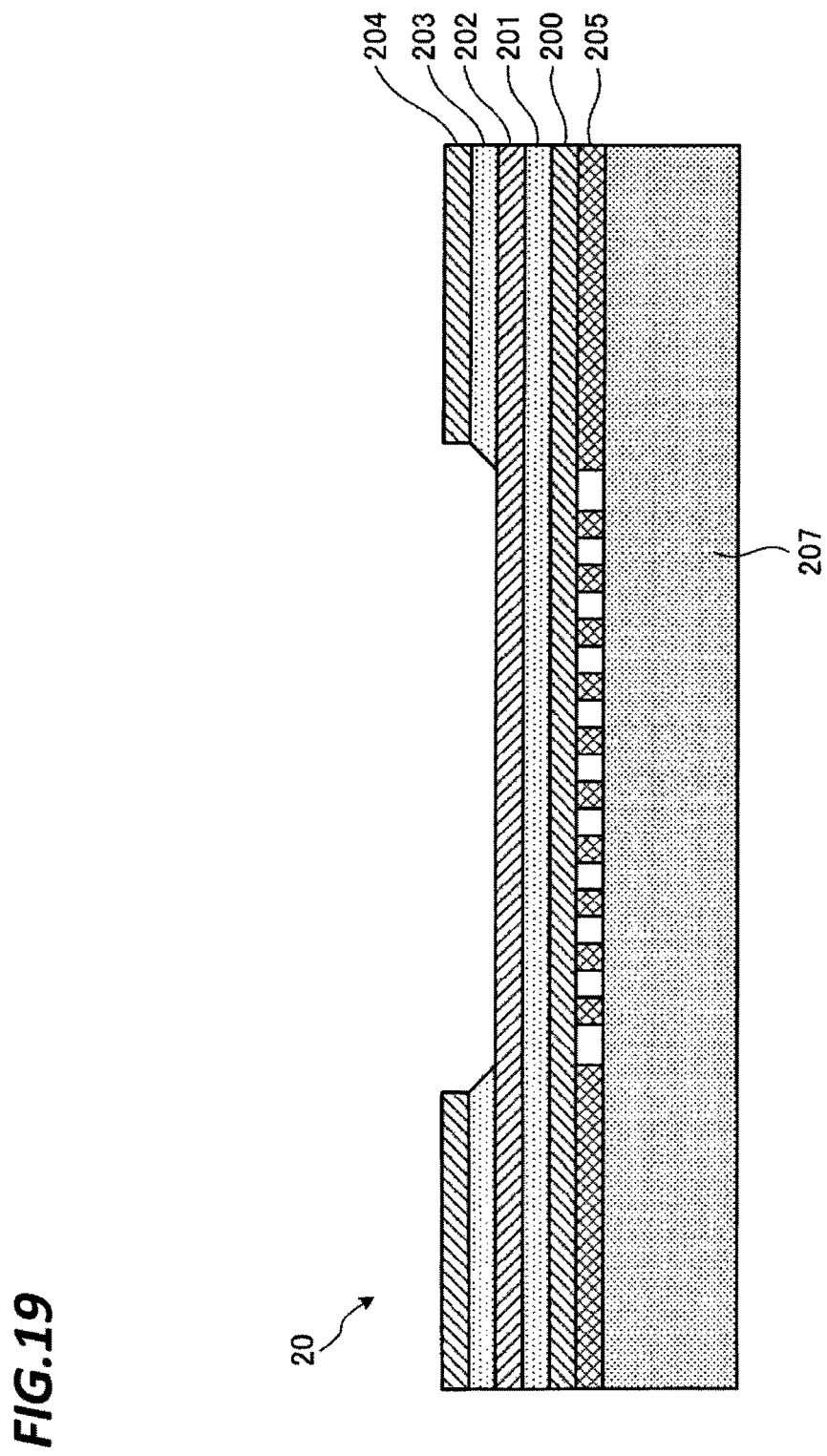
FIG. 19 is a cross-sectional view illustrating an exemplary floating film in the process of manufacture.

Then, a resist pattern is formed on the protective layer 204 corresponding to the area of the floating film 20, on which the heater 21 is formed (S205). Then, the portion of the protective layer 204, which is not covered by the resist pattern, is removed through, for example, an RIE (S206). Further, the portion of the heat transfer layer 203, which is exposed along the resist pattern, is removed by performing a wet etching using a chemical liquid such as, for example, potassium hydroxide (KOH) (S207). As a result, along the portion of the protective layer 204 which is not covered by the resist pattern, an opening is formed in the protective layer 204 and the heat transfer layer 203. When the process of step S207 is terminated, the floating film 20 has a cross-section, for example, as illustrated in FIG. 19.

Figure 20:
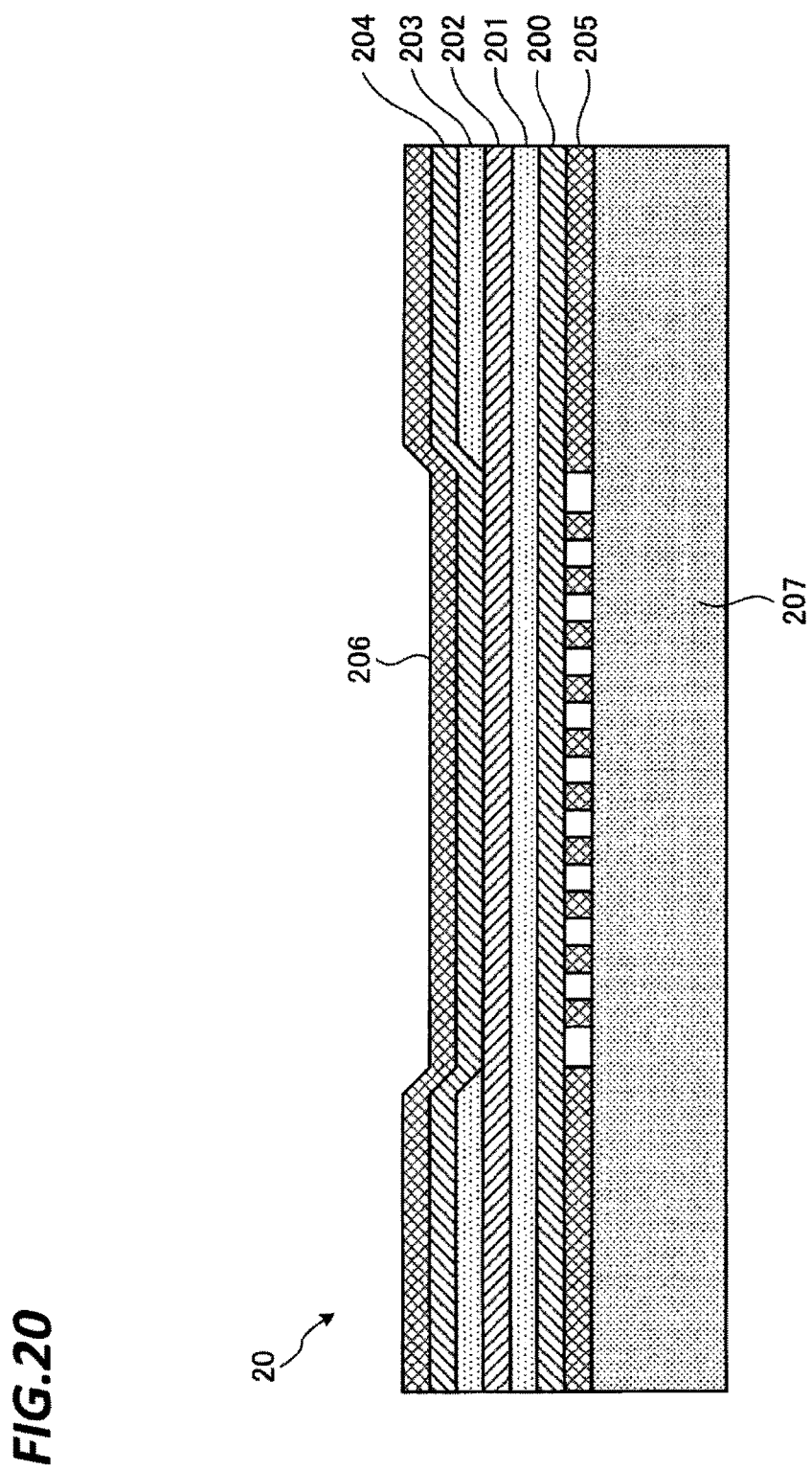
FIG. 20 is a cross-sectional view illustrating an exemplary floating film in the process of manufacture.

Then, in the opening formed by step S207, a protective layer 204 is formed of silicon nitride through, for example, a normal-temperature sputtering (S208). Thereafter, on the protective layer 204 formed at step S208, a conductor layer 206 is formed of a conductive material through the normal-temperature sputtering (S209). When the process of step S209 is terminated, the floating film 20 will have a cross-section, for example, as illustrated in FIG. 20.

Figure 21:
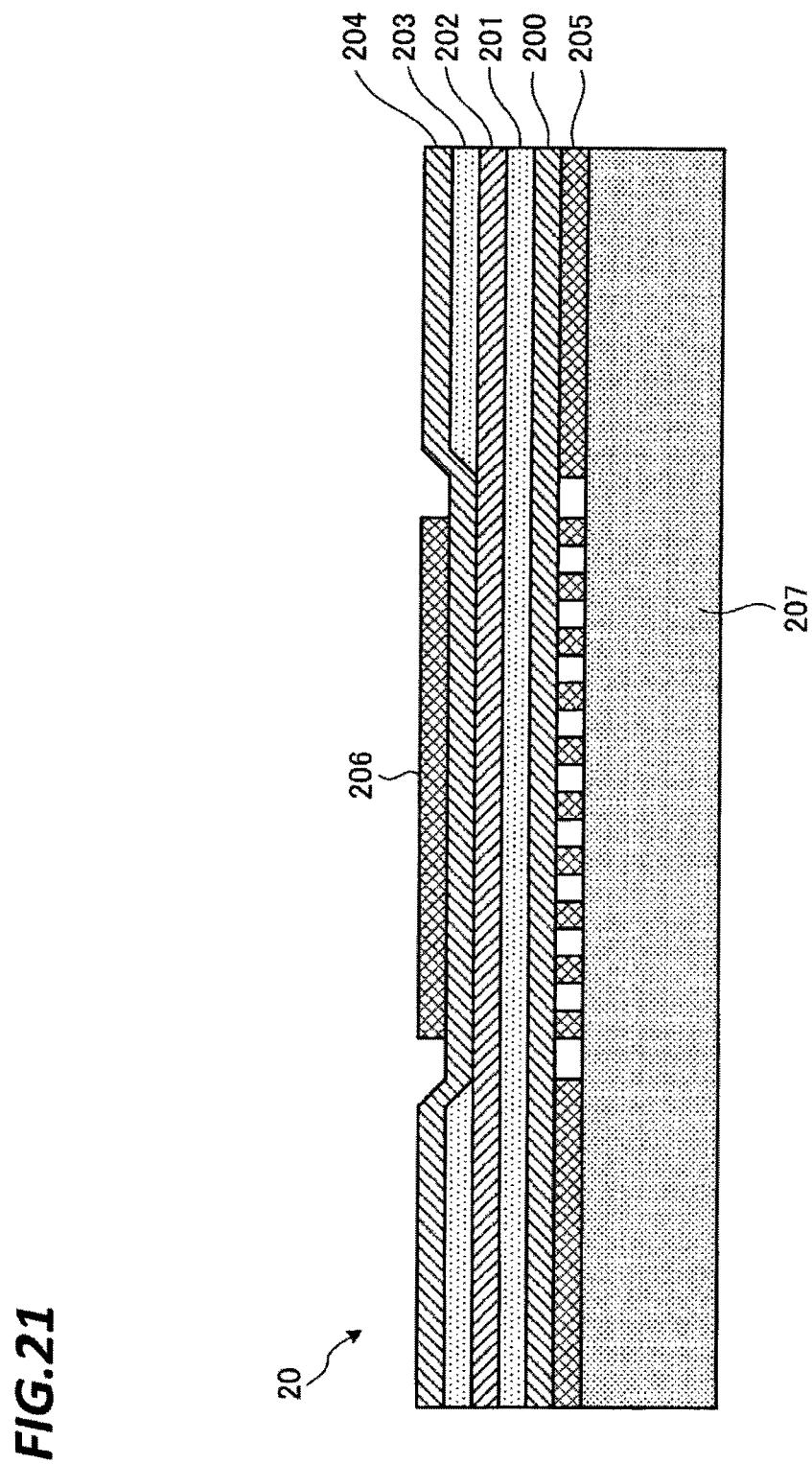
FIG. 21 is a cross-sectional view illustrating an exemplary floating film in the process of manufacture.

Then, on the conductor layer 206 formed at step S209, resist patterns corresponding to the respective shapes of the heater 21, the electrode pad 24a, and the electrode pad 24b are formed. Then, the portion of the conductor layer 206, which is not covered by the resist pattern, is removed by a milling by irradiation of, for example, argon ions (S211). When step S211 is terminated, the floating film 20 has a cross-section, for example, as illustrated in FIG. 21.

Figure 22:
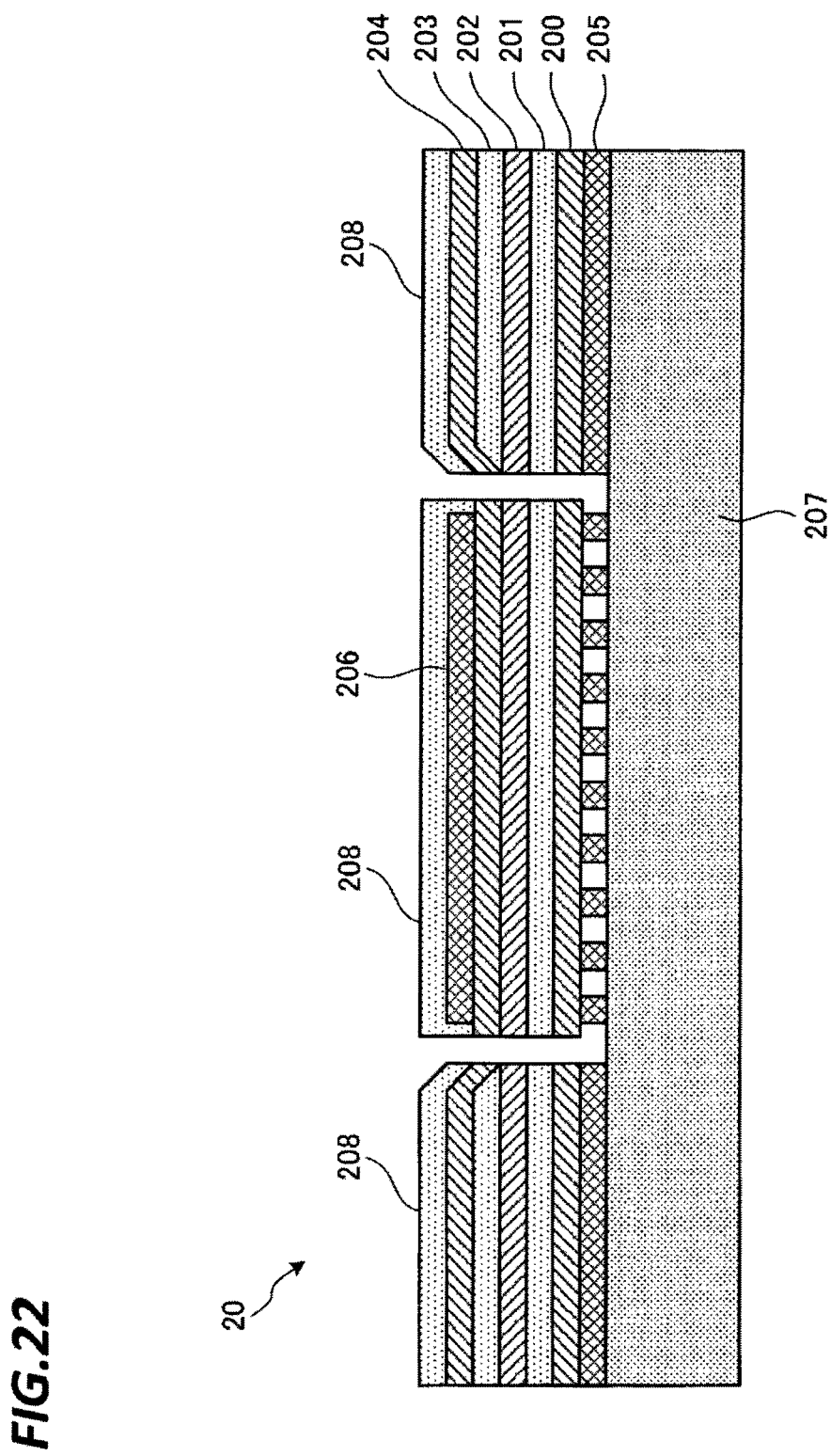
FIG. 22 is a cross-sectional view illustrating an exemplary floating film in the process of manufacture.

Then, on the protective layer 204 and the conductor layer 206, a resist pattern 208 corresponding to the shape of the floating film 20 is formed (S212). Then, the protective layer 204, the heat transfer layer 203, the insulation layer 202, the heat transfer layer 201, and the protective layer 200 on the portions of the conductor layer 206, which are not covered with the resist pattern 208, are removed through, for example, the RIE (S213). When the process of step S213 is terminated, the floating film 20 has a cross-section, for example, as illustrated in FIG. 22. FIG. 22 illustrates a cross-sectional view of the floating film 20 corresponding to the cross-section taken along line E-E of FIG. 13.

Figure 23:
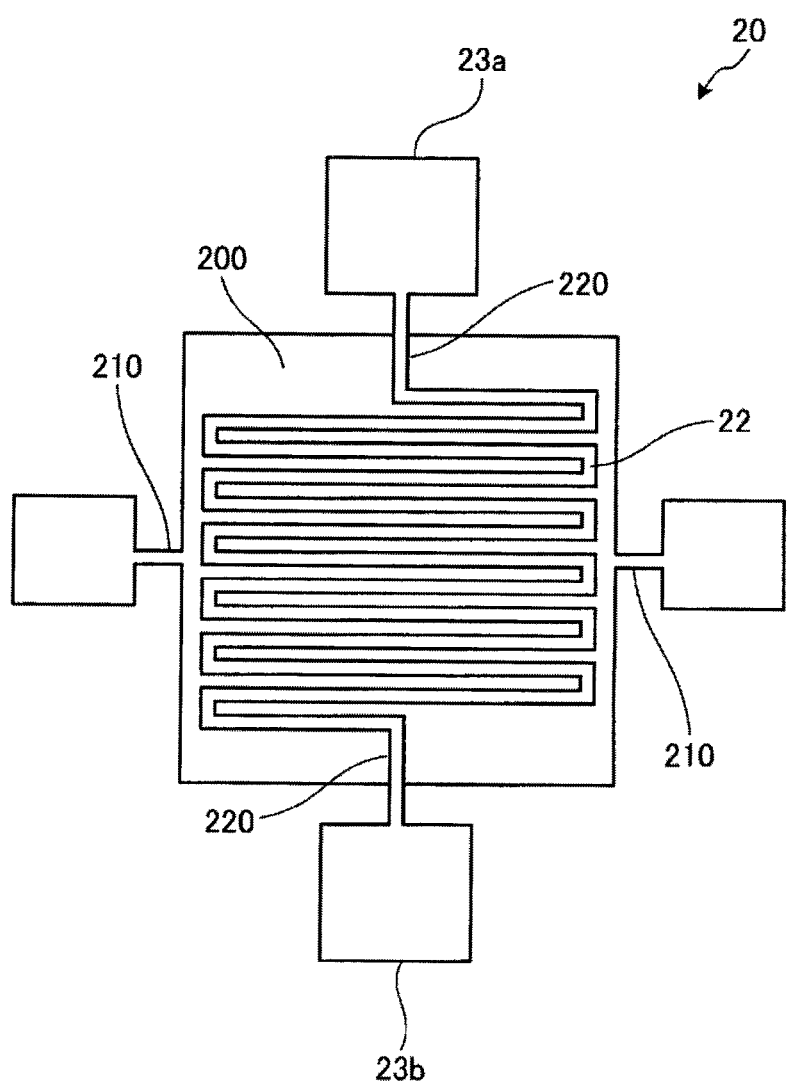
FIG. 23 is a plan view illustrating an exemplary floating film in the second exemplary embodiment.

After the processes of steps S200 to S213 are performed, when the resist pattern 208 and the support substrate 207 are removed, a floating film 20 is manufactured, for example, as illustrated in FIGS. 23 and 24. FIG. 23 is a plan view illustrating an exemplary floating film 20 at the side of the surface where the temperature senator 22 is formed, and FIG. 24 is a plan view illustrating an exemplary floating film 20 at the side of the surface where the heater 21 is formed.

Figure 25:
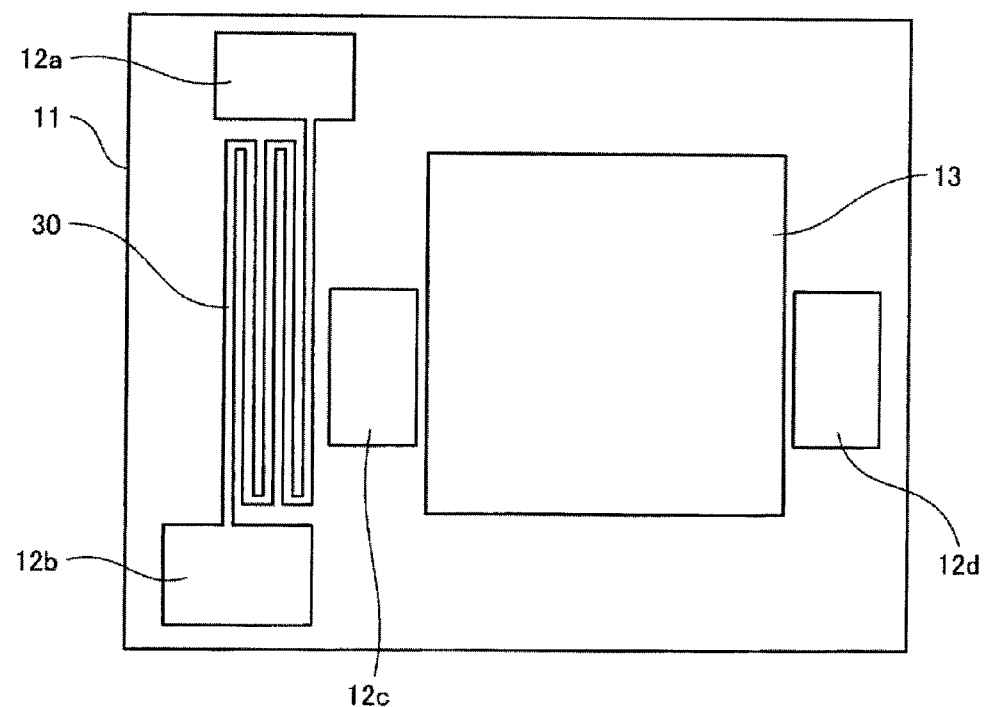
FIG. 25 is a plan view illustrating an exemplary base substrate in the second exemplary embodiment.

Then, for example, as illustrated in FIG. 25, a base substrate 11, on which electrode pads 12a-12d, a recess 13, and a temperature compensation body 30 are formed, is provided. Thereafter, the floating film 20 formed by performing the processes of steps S200 to S213 is disposed on the base substrate 11 to extend across the recess 13 formed in the base substrate 11, and bonded thereto (S214). In this case, the floating film 20 is disposed on the base substrate 11 such that the surface, on which the heater 21 is formed, faces the recess 13 in the base substrate 11. Further, the electrode pad 24a and the electrode pad 12c are bonded using, for example, a conductive adhesive, and the electrode pad 24b and the electrode pad 12d are bonded using, for example, a conductive adhesive. As a result, the sensor module exemplified in FIGS. 13 to 16 is manufactured.

In the foregoing, the second exemplary embodiment has been described.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A pressure sensor that outputs a temperature change caused in an electrical resistor according to a pressure of a gas, as a resistance change in the electrical resistor, the pressure sensor comprising:
   a base substrate including a recess formed therein;
   a floating film formed on the base substrate to extend across the recess;
   a heater formed on a surface of the floating film, the heater being configured to heat the floating film when a current flows therein; and
   a temperature sensor formed as the electrical resistor on the surface of the floating film, the temperature sensor being configured to change a voltage drop with respect to a current flowing therein according to a temperature of the floating film, wherein the current flowing in the temperature sensor is smaller than the current flowing in the heater.

2. The pressure sensor of claim 1, wherein the heater and the temperature sensor are formed on the same surface of the floating film.

3. The pressure sensor of claim 1, wherein the heater is formed on one surface of the floating film, and the temperature sensor is formed on a surface of the floating film which is opposite to the surface on which the heater is formed.

4. The pressure sensor of claim 1, wherein the current flowing in the temperature sensor ranges from 1/30 times to 1/5 times the current flowing in the heater.

5. The pressure sensor of claim 1, wherein the floating film includes a layer formed of an insulative material.

6. The pressure sensor of claim 1, wherein the floating film has a function of uniformizing heat generated by the heater within the floating film.

7. The pressure sensor of claim 6, wherein the floating film includes a layer formed of a silicon-containing material, and the function of uniformizing the heat generated by the heater within the floating film is implemented through the layer formed of the silicon-containing material.

8. The pressure sensor of claim 1, wherein the heater is formed of a material including at least one of platinum, nickel, chromium, and tungsten.

9. A method for manufacturing a pressure sensor that outputs a temperature change caused in an electrical resistor according to a pressure of a gas, as a resistance change in the electrical resistor, the method comprising:
   forming a heater on one surface of a floating film to heat the floating film;
   forming a temperature sensor as the electrical resistor on a surface of the floating film opposite to the surface on which the heater is formed, the temperature sensor being configured to change a voltage drop with respect to a current flowing therein according on a temperature of the floating film, wherein the current flowing in the temperature sensor is smaller than the current flowing in the heater; and
   disposing the floating film including the heater and the temperature sensor formed thereon on a base substrate including a recess formed therein to extend across the recess.

* * * * *